US009806220B2

(12) United States Patent
Moslehi et al.

(10) Patent No.: US 9,806,220 B2
(45) Date of Patent: Oct. 31, 2017

(54) METAL FOIL METALLIZATION FOR BACKPLANE-ATTACHED SOLAR CELLS AND MODULES

(71) Applicant: Solexel, Inc., Milpitas, CA (US)

(72) Inventors: Mehrdad M. Moslehi, Los Altos, CA (US); Thom Stalcup, Boulder, CO (US); Karl-Josef Kramer, San Jose, CA (US); Anthony Calcaterra, Milpitas, CA (US); Virendra V. Rana, Los Altos, CA (US); Sean M. Seutter, San Jose, CA (US); Pawan Kapur, Burlingame, CA (US); Michael Wingert, Los Gatos, CA (US)

(73) Assignee: OB REALTY, LLC, Irvine, CA (US)

( * ) Notice: Subject to any disclaimer, the term of this patent is extended or adjusted under 35 U.S.C. 154(b) by 0 days.

(21) Appl. No.: 14/539,978

(22) Filed: Nov. 12, 2014

(65) Prior Publication Data

US 2015/0129031 A1   May 14, 2015

Related U.S. Application Data

(60) Provisional application No. 61/903,267, filed on Nov. 12, 2013, provisional application No. 61/941,995, filed on Feb. 19, 2014.

(51) Int. Cl.
*H01L 21/00*  (2006.01)
*H01L 31/18*  (2006.01)
*H01L 31/0224*  (2006.01)
*H01L 31/068*  (2012.01)

(52) U.S. Cl.
CPC .. *H01L 31/1804* (2013.01); *H01L 31/022441* (2013.01); *H01L 31/0682* (2013.01); *Y02E 10/547* (2013.01); *Y02P 70/521* (2015.11)

(58) Field of Classification Search
None
See application file for complete search history.

(56) References Cited

U.S. PATENT DOCUMENTS

| 2004/0137659 A1* | 7/2004 | Ding | H01L 23/49816 438/106 |
| 2008/0210294 A1* | 9/2008 | Moslehi | H01L 31/042 136/251 |
| 2009/0227094 A1* | 9/2009 | Bateman | H01J 37/32412 438/514 |
| 2010/0175914 A1* | 7/2010 | Pramanik | H01G 4/18 174/256 |

(Continued)

*Primary Examiner* — Shaun Campbell
(74) *Attorney, Agent, or Firm* — Howard IP Law Group, PC

(57) ABSTRACT

A back contact solar cell is described which includes a semiconductor light absorbing layer; a first-level metal layer (M1), the M1 metal layer on a back side of the light absorbing layer, the back side being opposite from a front side of the light absorbing layer designed to receive incident light; an electrically insulating backplane sheet backside of said solar cell with the M1 layer, the backplane sheet comprising a plurality of via holes that expose portions of the M1 layer beneath the backplane sheet; and an M2 layer in contact with the backplane sheet, the M2 layer made of a sheet of pre-fabricated metal foil material comprising a thickness of between 5-250 μm, the M2 layer electrically connected to the M1 layer through the via holes in the backplane sheet.

14 Claims, 27 Drawing Sheets

(56) References Cited

U.S. PATENT DOCUMENTS

2013/0213469 A1* 8/2013 Kramer .......... H01L 31/022458
  136/256
2013/0244371 A1* 9/2013 Sewell ............ H01L 31/022441
  438/96

* cited by examiner

Cell Fab Process Prior to Lamination

Starting Reusable Template (p-type CZ or Multicrystalline wafer) – Reuse Clean
210

(i) Form Porous Silicon Epitaxial Seed & Release Layer (e.g., With 2 Porosities), (ii) Deposit In-Situ-Doped Thin (e.g., ~1 μm to 80 μm) Epitaxial Silicon Layer
220

Form Doped Patterned Emitter (e.g., p+) Junction Regions, Doped Patterned Base (e.g., n+) Regions, Rear Passivation, Base and Emitter Contact Openings
130

Form Patterned First-Level Cell Metallization (M1): Interdigitated, Fine-Pitch Fingers (e.g., interdigitated Al metal for base & emitter) by Screen Print or PVD
140

Laminate Partially-Processed Cell or a Plurality of Cells on Their Metallized Backside(s) to a Continuous, Electrically Insulating Backplane Sheet (e.g., Thin Prepreg Sheet)
150

Cell Fab Process After Lamination

Release of the backplane attached epitaxial layer may (e.g., mechanical fracture release, chemical wet etch, air flow release)
255

Complete Frontside Cell Processing: (i) iCell Trench Cuts, (ii) Frontside Texture and Post-Texture Clean; (iii) PECVD Frontside Passivation and ARC
260

Laser Drill Backplane Via Holes
170

Surface activation (e.g., ion cleaning, grip blasting for example using baking soda or sand, atmospheric pressure radical clean)
175

Laminate and Pattern Second-Level (M2) Metallization on Backplane Sheet
180

Manufacture the PV Module by Interconnecting a Plurality of Solar Cells and Final Module Lamination of the Solar Cells in Either a Flexible/Lightweight Module (Flexible Fluoropolymer Front Cover) or a Glass-Covered Rigid Module
190

FIG. 2

M2 Metallization 180
Example Embodiment 1

Laminate/ attach M2 Solderable Metal Foil & Form Fused M2-M1 Conductive Via Plugs
310

Pattern Foil (e.g., Laser Ablation or Masked Wet Etch Process) for M2
320

FIG. 3

M2 Metallization 180
Example Embodiment 2

Laminate/ attach M2 Metal Foil
410

Print Solder Bumps
420

Solder Reflow Anneal
430

Pattern Foil (e.g., Laser Ablation or Masked Wet Etch Process) for M2
440

FIG. 4

M2 Metallization 180
Example Embodiment 3

---

Via Clean
510

---

PVD Solderable Seed Layer (e.g., NiV/Sn)
520

---

Laminate Solderable M2 (e.g., Solderable Aluminum) Metal Foil
530

---

Pattern Foil (e.g., Laser Ablation or Masked Wet Etch Process) for M2
540

FIG. 5

M2 Metallization 180
Example Embodiment 4

Laminate/ attach M2 Metal Foil
610

Pulsed ns Laser Irradiation of Via Regions Over Metal Foil to Form Conductive M2-M1 Via Plugs
620

Pattern Foil (e.g., Laser Ablation or Masked Wet Etch Process) for M2 (may be same tool as prior step)
630

FIG. 6

M2 Metallization 180
Example Embodiment 5

Print Solder Bumps Within Vias
710

Laminate M2 Metal Foil & Solder Reflow
720

Solder Reflow Anneal
730

Pattern Foil (e.g., Laser Ablation or Masked Wet Etch Process) for M2
740

FIG. 7

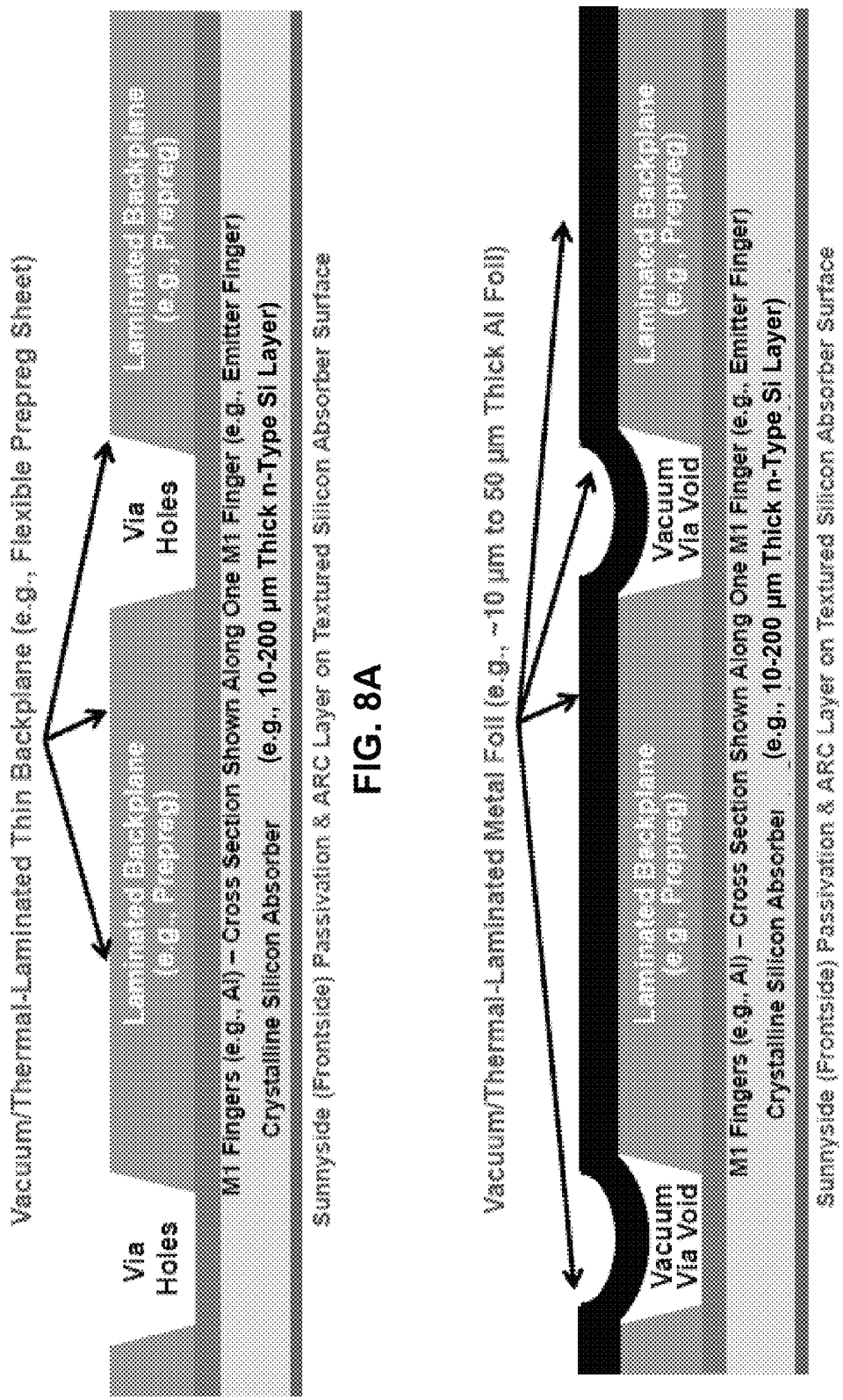

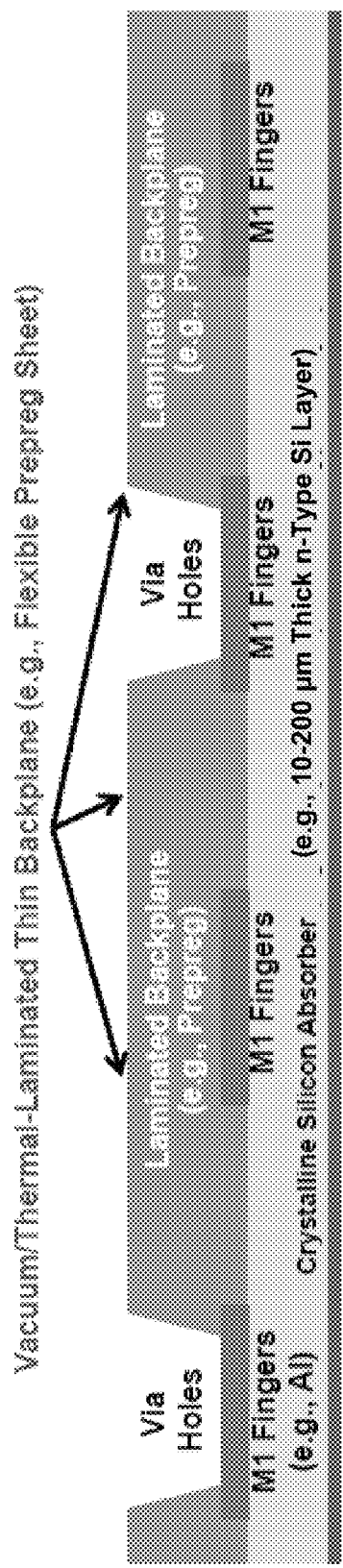
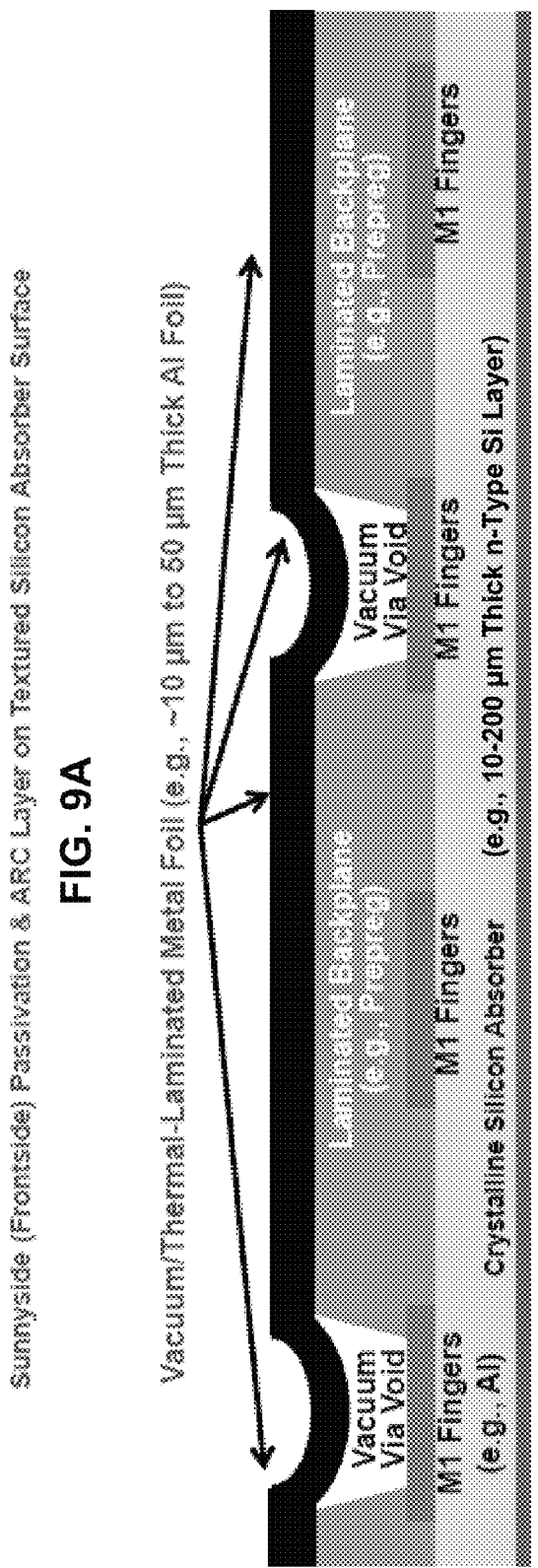
FIG. 9A
FIG. 9B

METAL FOIL METALLIZATION FOR BACKPLANE-ATTACHED SOLAR CELLS AND MODULES

CROSS REFERENCE TO RELATED APPLICATIONS

This application claims the benefit of U.S. Provisional Application No. 61/903,267, filed Nov. 12, 2013, and U.S. Provisional Application No. 61/941,995, filed Feb. 19, 2014, both of which are incorporated by reference in their entirety.

BACKGROUND

1. Field of Art

This description generally relates to photovoltaic solar cells, and particularly to metal layers used as electrical interconnections in solar cells as well as cell-to-cell interconnections in solar modules.

2. Description of the Related Art

There are a number of existing types of photovoltaic solar cells. One type of solar cell design is an interdigitated back contact (IBC) solar cell (or back contact solar cell in short). A back contact solar cell may be advantageous over a front contact solar cell in that both the base and emitter contacts of the solar cell are located on the back side of a semiconductor light absorbing layer (opposite the sunnyside of the solar cell). As a result, light incident on the front side of the light absorbing layer is not obstructed by a front side electrical metallization grid. This has the beneficial effect of increasing the amount of sunlight that may be received by the solar cell per unit area of solar cell surface area (due to elimination of optical shading losses). To accommodate both base and emitter contacts on the back side of the light absorbing semiconductor layer, the corresponding base and emitter metallization fingers are commonly interdigitated relative to each other, hence the name IBC solar cell.

Metallized base and emitter contacts on the back surface of the light absorbing semiconductor layer are typically low resistance electrically conductive (e.g., metal) contacts designed to carry charges away from the light absorbing layers as photogenerated electrons and holes selectively arriving at the electrically conductive contacts from the light absorbing semiconductor layer. To reduce recombination at the junction where the metallized contacts meet the light absorbing semiconductor layer, generally small metallized contacts (with relatively small area fraction) in physical contact with the light absorbing semiconductor layer may be advantageous. However, thin metallization lines also may have relatively high electrical ohmic resistance, particularly given the distance which the electrical current must be carried away from the individual solar cells (for base and emitter) to an external connection (e.g., solar cell busbar). To address this issue, IBC solar cells may use a dual-layer (or two-level) metallization structure, wherein a first-level metallization, also known as contact metallization (M1), is designed to reduce contact recombination and to extract the solar cell power (e.g., typically a finer pitch and thinner metallization relative to M2), and a charge carrying metallization (M2) is designed for low resistance (e.g., thicker with higher sheet conductance relative to M1) and long-range power transport out of the solar cell (and interconnections between the solar cells in a solar module). The M1 and M2 layers may be separated by an electrically insulating layer, and connected in designated regions by via holes drilled (e.g., by laser) in the insulating layer.

Often, an M2 layer may be formed via some form of physical vapor deposition (PVD). While PVD has the advantage of allowing for an in-situ clean step or surface etch step prior to M2 deposition, thus allowing for the removal of oxide from the M1 layer and allowing for a strong physical and electrical connection between the M1 and M2 layers, it may be expensive to perform. And while PVD is perfectly suitable for use in depositing relatively thin layers such as the M1 layer, PVD costs may scale up when depositing relatively thick layers such as the M2 layer. Generally, the thicker the M2 layer, the lower the resistance and thus the better the performance of the M2 layer, however the greater the cost of the solar cell as a whole.

BRIEF DESCRIPTION OF DRAWINGS

FIG. 2 describes a process for forming a back-contact solar cell using a reusable template, a release and seed layer, and an epitaxially grown semiconductor layer for the solar cell absorber, according to one embodiment.

FIG. 3 describes a process for adding the second-level (M2) metallization layer to a solar cell on top of an electrically insulating layer, according to a first embodiment.

FIG. 4 describes a process for adding the M2 metallization layer to a solar cell, according to a second embodiment.

FIG. 5 is a process for adding the M2 metallization layer to a solar cell on top of an electrically insulating layer, according to a third embodiment.

FIG. 6 is a process for adding the M2 metallization layer to a solar cell on top of an electrically insulating layer, according to a fourth embodiment.

FIG. 7 is a process for adding the M2 metallization layer to a solar cell on top of an electrically insulating layer, according to a fifth embodiment.

FIG. 8A-8E illustrate an interdigitated back-contact solar cell at various stages throughout the process of forming a solar cell along a direction perpendicular to M2 fingers, according to the second embodiment.

FIG. 9A-9E illustrate an interdigitated back-contact solar cell at various stages throughout the process of forming a solar cell along a direction parallel to M2 metal fingers, according to the second embodiment.

Figure 1:
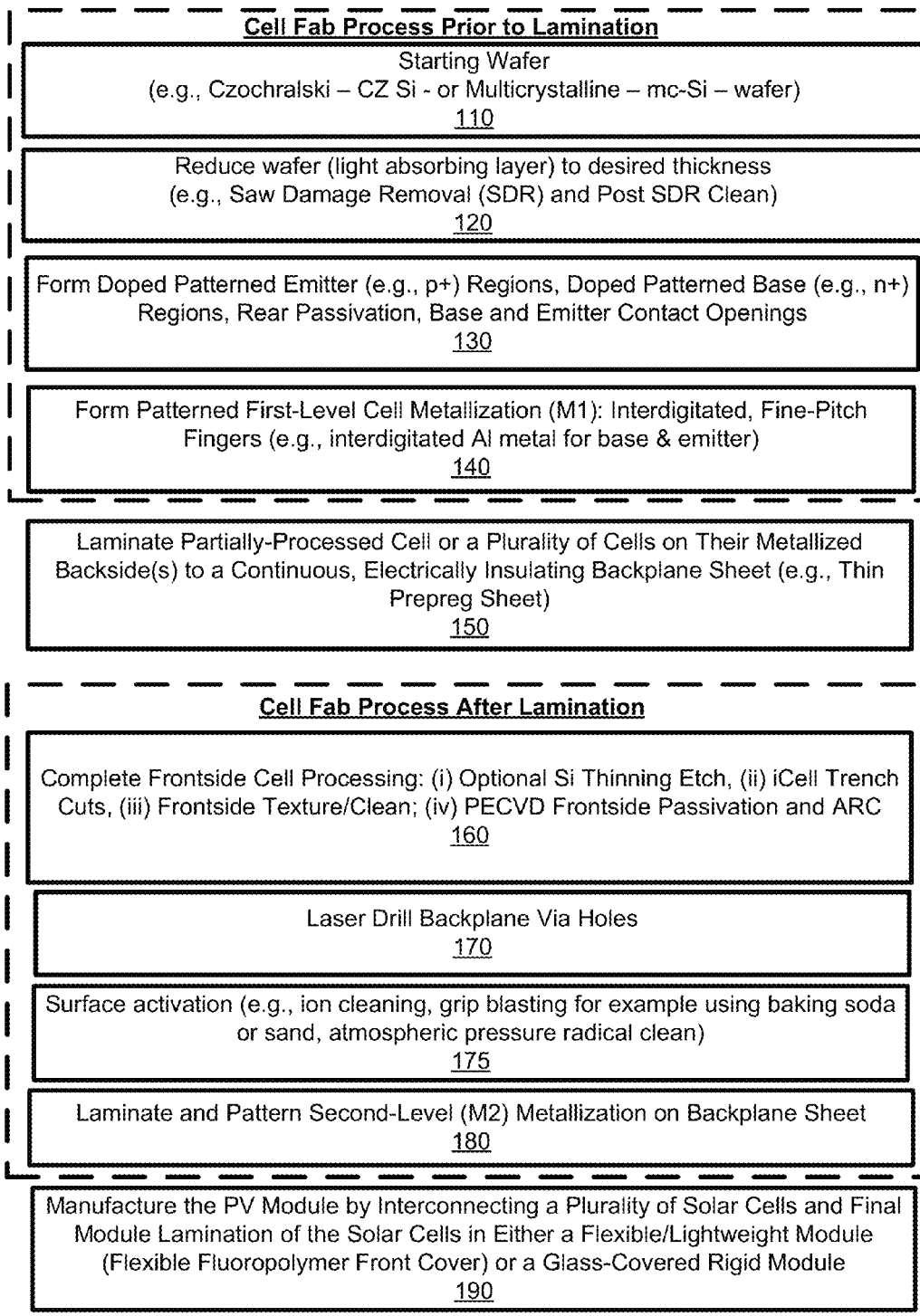
FIG. 1 describes a process for forming a solar cell using a semiconductor wafer as a starting material and using an essentially dual layer (M1+M2) metallization scheme in conjunction with a back-contact solar cell, according to one embodiment.

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

I. Example Backplane-Attached Photovoltaic Solar Cell

I.A. Overview

A low cost, back contact (for example an interdigitated back contact), solar cell with multilayer metallization that uses a roll, sheet, or foil of low cost, pre-fabricated, conductive material (e.g., a high-electrical-conductivity foil material comprising aluminum and/or copper) as its M2 layer (referred to herein as the M2 foil or M2 layer or M2 metallization), and manufacturing method for a solar cell including such multilayer metallization is provided. The multi-layer metallization in the solar cell described herein may provide a means for highly conductive and low-ohmic-loss electrical connection between the M1 and M2 layers, while reducing overall solar cell manufacturing cost and fabrication complexity. Particularly compared to M2 metallization formed by physical-vapor deposition or PVD (e.g., evaporated and/or plasma-sputter-deposited metallization) or plated (e.g., plated metallization comprising copper) metal deposition, the described solar cell architecture may provides an opportunity to achieve significantly reduced costs for materials, tooling, and labor, because inexpensive thin foils of materials comprising aluminum (Al), copper (Cu), tin (Sn) or combinations thereof may enable a very low material cost means of providing highly electrically conductive layers enabling desirable high fill factor high-efficiency solar cells and the application of foil by lamination uses equipment and tooling with low capital expenditure and low process cost.

In some implementations, the M2 metal layer (e.g., metal foil or sheet) may be pre-coated with a low melting temperature solder (e.g., a solder comprising tin and/or bismuth). In some embodiments, during fabrication, the M2 layer may be added to the solar cell via a single lamination step (such as a vacuum thermal press lamination using a combination of high lamination pressure and heat under reduced pressure or vacuum). This lamination step may include heating as well as pressure and vacuum conditions. In various other embodiments, additional solder material may be added before or after the M2 layer lamination step, additional thermal lamination/anneal steps may be performed, PVD may be used to remove oxides on the M1 layer (e.g., by argon plasma etch) and deposit a seed layer of metal, which in turn may consist of one or more than one metal seed layer, such as Al, followed by NiV and Sn to contact the underlying M1 layer, as well as provide a surface onto which a subsequently laminated foil may be conductively and permanently bonded or soldered to by means of a thermal lamination process. Alternatively or in conjunction a laser beam may be used to weld or fuse the M1 and M2 layers after lamination of the M2 layer. The desired end result in all cases is a strong and low-resistance electrical and physical connection between the M1 and M2 layers through the vias in the electrically insulating backplane sheet (such as a prepreg sheet). Various embodiments of the solar cell and their methods of fabrication are described below.

I.B. General Structure

Figure 16A:
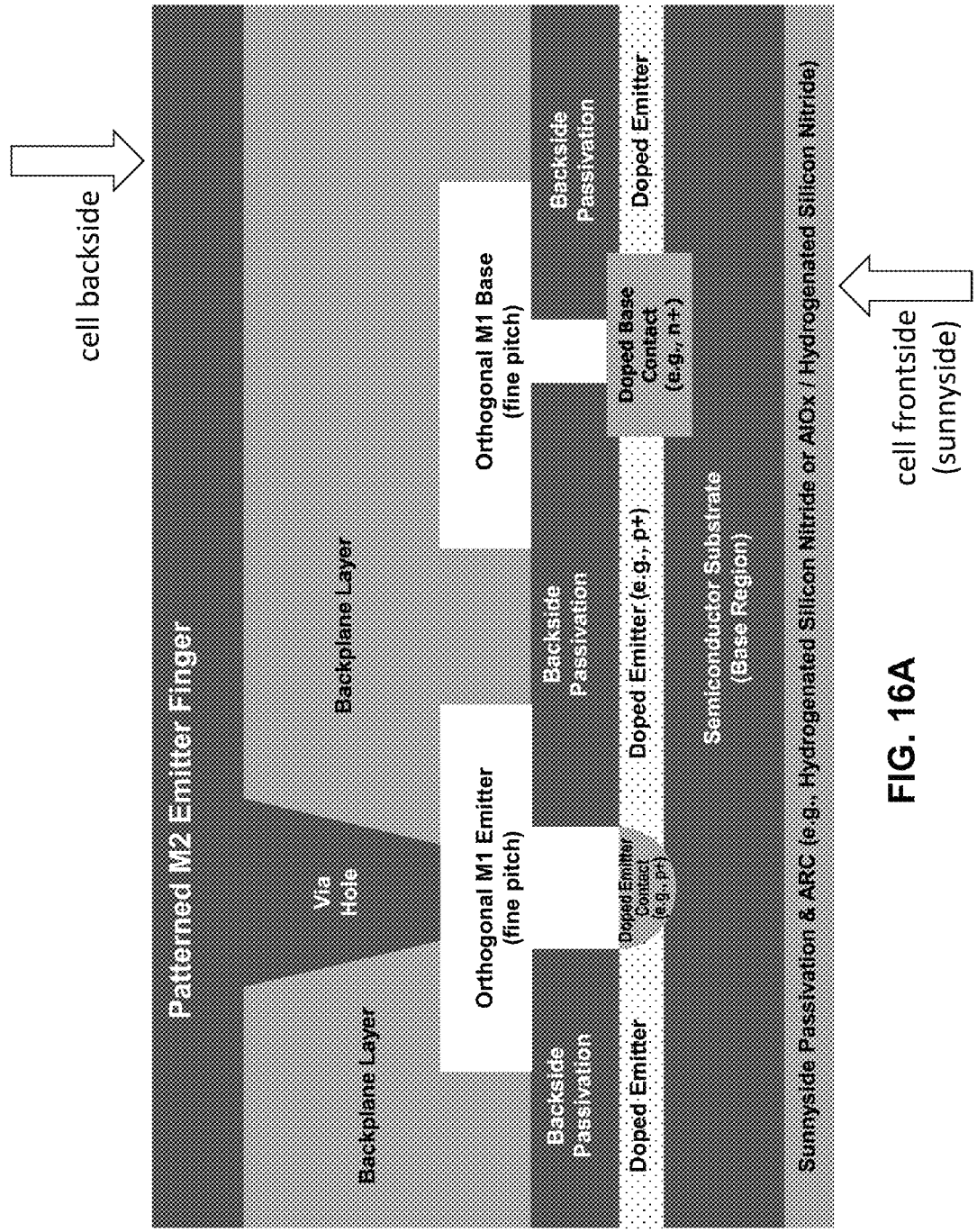
FIG. 16A is a cross-sectional diagram showing a portion of an M1/M2 emitter connection including the connection between M1 emitter fingers and orthogonal M2 emitter fingers by via, according to one embodiment.
Figure 16B:
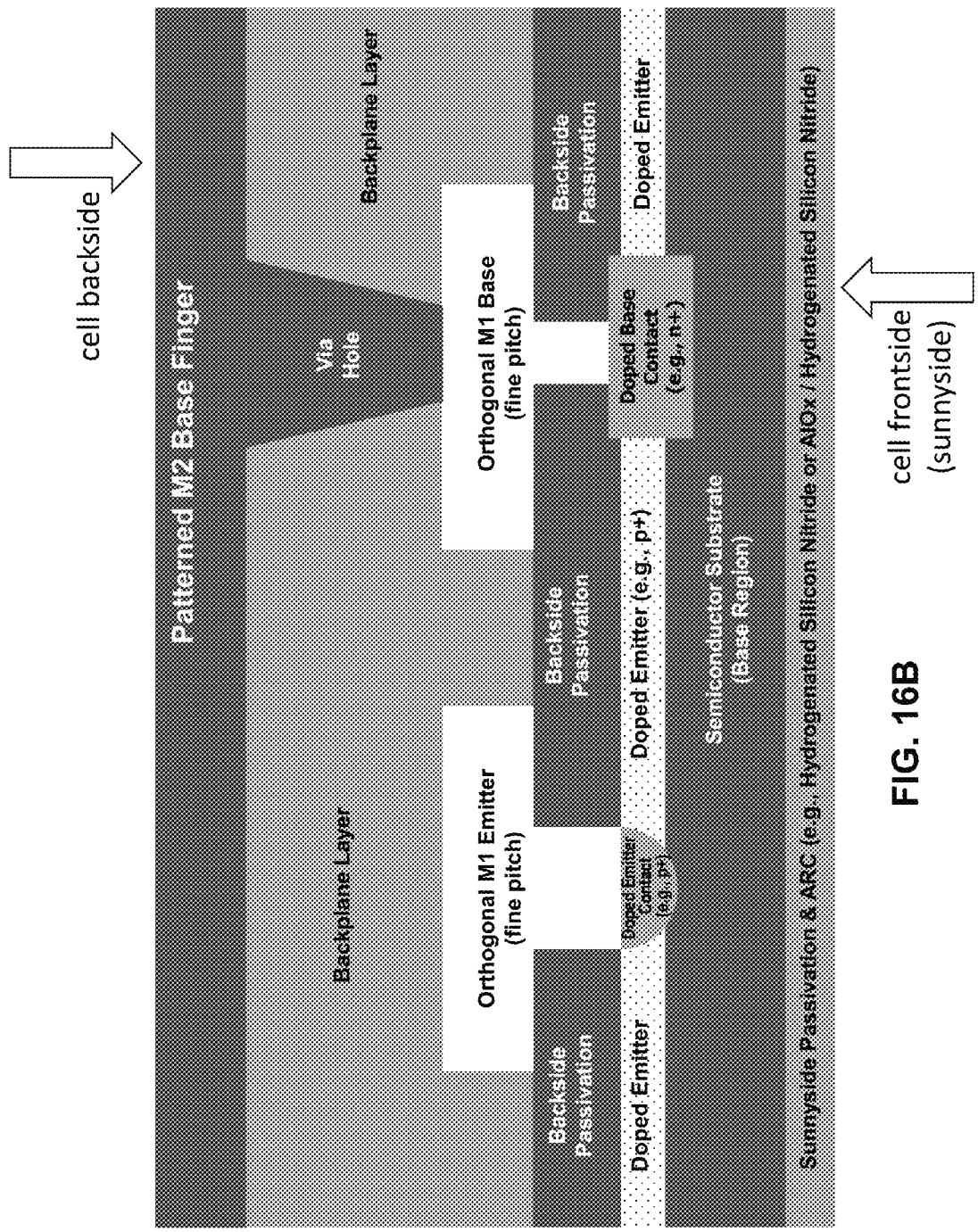
FIG. 16B is a cross-sectional diagram showing a portion of an M1/M2 base connection including the connection between M1 base fingers and orthogonal M2 base fingers by via, according to one embodiment.

FIGS. 16A and 16B are cross-sectional diagrams of portions of a back-contact solar cell showing an orthogonal M1/M2 emitter connection and an orthogonal M1/M2 base connection, respectively, and are provided as descriptive example embodiments of detailed cell architectures which may be used in accordance with the disclosed subject matter. FIG. 16A is a cross-sectional diagram showing a portion of an M1/M2 emitter connection including the connection between M1 emitter fingers and orthogonal M2 emitter fingers by via. FIG. 16B is a cross-sectional diagram showing a portion of an M1/M2 base connection including the connection between M1 base fingers and orthogonal M2 base fingers by via. The examples embodiments of FIGS. 16A and 16B may be produced according to the example processes described with respect to FIGS. 1 and 2 described below.

The solar cell includes a semiconductor light absorbing layer such as mono-crystalline Si (e.g., wafers from Czochralski (CZ) Si or from multi-crystalline Si (mc-Si) or from epitaxially deposited silicon, deposited on carrier wafers (templates) with a seed and release layer (e.g. porous silicon), and subsequently laminated and released from said carrier wafer after partial processing of the solar cell. The dopant type of the Si may vary (e.g., n-type or p-type). Example thicknesses for the components of the solar cell are listed in Table 1 below. The resulting solar cell has approximately may have between 20 to more than 25% solar cell efficiencies and ≥18% photovoltaic (PV) module efficiencies (under standard test conditions or STC).

The backside of the light absorbing layer is physically (including optically) and electrically coupled to a first metal layer (M1). The material of the M1 layer may be Al, an Al—Si paste, or another conductive material. The M1 layer may generally not cover the entirety of the backside surface area of the light absorbing layer, as this may negatively affect device performance. Instead, the M1 layer is formed or patterned in an interdigitated pattern for high-efficiency back-contact solar cells, balancing the competing performance issues of contact recombination losses induced due to the presence of the electrical contact against the light absorbing layer versus bulk recombination losses induced due to long charge carrier travel times to reach one of the digits of the M1 layer. Another trade-off is between the contact recombination losses and contact resistive ohmic losses. In general, the overall contact area of the M1 layer to the silicon absorber material is kept much smaller than the physical M1 area (with such contact area being a relatively small fraction of the solar cell area, for instance, less than 10%, and in some instances less than 5% total contact area). This is enabled by having locally patterned and opened dielectric passivation material between the M1 metal layer and the silicon absorber layer. Such patterning may be performed be using laser ablation or other patterning techniques such as screen or ink jet printing of a masking layer, followed by local etching of the dielectric and removal of the printed masking layer. The first layer of metal (M1) may have a relatively fine-pitch interdigitated pattern of emitter and base metal fingers.

A flexible, electrically-insulating backplane sheet may be physically coupled to the backside of the partially-processed solar cell comprising the patterned M1 layer and the back side dielectric passivation layer (hence the use of the term "backplane") for example by means of a lamination process, such as a vacuum thermal-pressure lamination process. The backplane sheet may be constructed of a variety of materials. In one implementation, the backplane sheet may be a prepreg sheet (e.g., in one particular instance a combination of aramid fiber impregnated with resin) which is laminated onto the M1 side of the cell. The prepreg sheet may have a thickness in the range of about 25 microns up to about 1000 microns, and in some instances in the range of about 50 microns and 100 microns. A plurality of via hole (or vias) are drilled (for example by laser drilling) through the backplane sheet, thereby locally exposing the back surface of the M1 layer for subsequent further electrical contacting.

A second metal layer (M2) then physically contacts the backplane sheet. The M2 layer also physically contacts, through the vias in the backplane sheet, either the M1 layer directly, or one or more other electrically conductive materials such that the M2 layer is electrically connected to the M1 layer (for example through a metal plug, formed for instance with the help of solder balls in the via regions). Note that in order to achieve a large process window to manufacture such via connections, it may be advantageous to design so-called landing pads (metal posts or pillars) into the M1 layer. These are regions that may be wider, in order to loosen alignment tolerances for the via drill, as well as thicker (raised posts), in order to loosen drilling power and conditions for the via drill process. The M1 material may also, at least locally, consist of a stack of more than one material, such as more than one metallic paste, wherein the upper paste is designed such that it provides a particularly good stopping power for the via drill, which may be particularly advantageous if the via is drilled using a laser beam.

As introduced above, the M2 layer may be formed of a sheet of relatively inexpensive highly electrically conductive material, such as a commercially-available metal foil comprising aluminum and/or copper. The metal foil may be Cu foil, Silver (Ag) foil, solderable Al foil or tin (Sn). In some instances, aluminum and copper foils may be advantageous over silver foil due to their much lower material cost compared to silver. Solderable foils are often pre-coated (e.g., plated) with Ni or Ni-Vanadium (NiV) or Zn and/or Sn as they interface well with metals like copper and/or Al. This bottom material may then be coated with a solder such as Sn, Bi, Zn, or any alloy thereof. In some instances, a particularly advantageous combination may be a Sn/Zn/Bi solder combination when used with Al M2 foil and sintered aluminum paste landing pads/cap in combination with a prepreg (e.g. aramid fiber and resin based prepreg), or a combination thereof. The presence of the solder may facilitate alloying/thermal fusing of M2 foil to the M1 layer. One example choice for the M2 foil is inexpensive 1100 series Al foil.

Between the M1 layer and the backplane sheet, the M1 layer may contain additional raised landing pads of conductive material that are located where the vias are formed. The metallic landing pads serve as a blocking material that make it easier to control via drilling through the backplane sheet. The raised landing pads are drilled more slowly than the backplane sheet, allowing the drilling of the via holes (for example, by laser drilling) to be more carefully drilled to a desired depth, with reduced risk of drilling through the M1 layer which may render the solar cell inoperable.

In some implementations, the M1 landing pads may be drilled all the way through the raised pads (hence, consuming the pads) while drilling the via holes through the backplane, and thus most of the volume and mass of the original M1 landing pads are not present in the final solar cell structure. However, in some implementations, the M1 landing pads are not drilled all the way through (only partially removed). Instead, the vias are drilled partway into the landing pads (used as laser drilling stopping pads), and the remainder of the landing pads are left at the bottom of the vias on top of the M1 layer to assist in physically and electrically connecting the M1 and M2 layers. Herein for simplicity, any connection to the M1 layer may also be a connection to landing pads on top of the M1 layer interchangeably.

The M1 landing pads may be made of one or more materials. A first landing pad material (e.g., a printed Ni paste such as NiV) interfaces well with the M1 layer. A second such material (e.g., Sn or deposited on the Ni paste) interfaces well with the first landing pad material and also acts as a solder that can be thermally fused with the M2 foil once it is added. These landing pads may separate from any other solder or seed materials that are later added to assist in connecting the M1 and M2 layers. Importantly, while in some instances the use of M1 landing pads may improve the via laser drilling process margin, the M1 landing pads optionally may or may not be used depending on additional fabrication considerations including, among others, cost.

Like the M1 layer, the M2 layer may also be formed in an interdigitated finger pattern. The patterned M2 fingers may be oriented in a direction essentially perpendicular or orthogonal to the M1 fingers or essentially parallel to the M1 fingers. Combinations thereof with comb-like structures for M1 or M2 are also possible as are parallel M1/M2 orientations. The number of M2 fingers may be much smaller than the number of M1 fingers (e.g., by a factor of about 10 to 50), enabled by the orthogonal orientation of the M2 fingers with respect to the M1 fingers. Therefore, M1 may have a relatively fine-pitch interdigitated pattern with relatively narrow metallization fingers (e.g., approximately 0.25 mm to 1.5 mm wide) whereas M2 may have a coarse-pitch interdigitated pattern with relatively wide fingers (e.g., approximately a few mm to ~25 mm wide).

The solar cells may be fabricated as individual backplane-attached solar cells, where each solar cell (for example, each cell or each isled cell) is individually attached to its own separate pre-cut backplane sheet (i.e., each solar cell having its own pre-cut backplane with a backplane area on the order of the individual solar cell area), also referred to as a non-monolithic module process flow). Alternatively, the solar cells may be fabricated with a continuous ("monolithic") backplane forming a number of solar cells with the process for fabrication being referred to as a monolithic module process flow. In addition, each cell may be subdivided into individual subcells (such solar cells also being called isled cells or iCells herein) where the individual subcells within each solar cell are isolated by trenches through the silicon cell absorber and thus are electrically separated silicon absorbers as well as having electrically separated M1 layers and are reconnected using the M2 layer. This reconnection (e.g., M2 reconnection) may be done in parallel, in series, or in a combination thereof. An advantageous embodiment is a connection of such individual subcells within an isled cell (iCell) in such a way that several subcells are connected in series, leading to a multiplication of the open circuit voltage while at the same time generating less current. Such an embodiment has the advantage of having lower ohmic losses and requiring thinner amount of metal, which by itself may substantially lowers the metallization ohmic losses and cost.

To help ensure an effective electrical connection between the M1 and M2 layers, some embodiments of the solar cell also use additional components such as solders, PVD seed layers, or other materials. Additional detail regarding various implementations for processes for fabricating the solar cell and the components included in those structures for forming physical and electrical contact between the M1 and M2 layers are described below.

II. Example Solar Cell Fabrication Process

Solar cells may be fabricated starting with either semiconductor (e.g., crystalline Si) wafers or using epitaxially grown semiconductor layers (e.g., by growing crystalline Si from silicon-containing gas such as trichlorosilane). As these processes vary to some extent, they are described separately. Figure (FIG. 1 is a process for forming a solar cell using a semiconductor wafer (e.g., a CZ silicon wafer) as a starting material, according to one embodiment. FIG. 2 is a process for forming a solar cell using a reusable template and an epitaxially grown semiconductor (e.g., epitaxial silicon) as starting material, according to one embodiment.

II.A Wafer as a Light Absorbing Layer

In reference to the process illustrated in FIG. 1, the fabrication process can be split into several subgroups of steps, including those that occur prior to the lamination of the backplane sheet (front-end processing), and those that occur after the lamination of the backplane sheet (back-end processing).

Prior to the lamination of the backplane sheet, the fabrication process begins 110 with a semiconductor wafer. The wafer may, for example, be czochralski silicon (CZ Si), multi-crystalline silicon (mc-Si), or another semiconductor.

At the onset, saw damage removal (SDR) is performed by etching away some silicon from the surface of the wafer to remove the surface damage left by the wire saw process. 120. Note that at a later stage, for example after lamination, further reduction of wafer thickness can be achieved by different methods, such as mechanical surface grinding or wet chemical silicon etching. After saw damage removal, the wafer is then cleaned, for example in the same wet process tool.

To implement the interdigitated back contact architecture into the cell, several process embodiments may be employed to form doped emitter and base regions 130. For example in one advantageous embodiment, a sequence of doped dielectrics, including doped Al2O3 or SiO2 may be used to provide precursors to diffuse boron and phosphorus into the backside of the wafer. Such dielectrics may also serve as passivation layers for the back side. Prior to thermal diffusion, such dielectrics may be suitably patterned, for instance by local laser ablation, or by masked patterning steps such as screen or ink jet printing, followed by etching and stripping of the masking layers. Contact to the diffused junctions may be made by locally removing dielectrics, for instance again using laser ablation or a masking/etching combination as described above.

In another embodiment for forming the patterned back junctions and back contacts, ions are implanted into the back side of the wafer (i.e., the side opposite from the front side upon which light will impinge on the wafer/light absorbing layer). Generally, base dopings (e.g., n+ implants) that will align with the base contact (i.e., the portion of the M1 layer dedicated to the base contact) are implanted on the back side of the wafer. Emitter dopings (e.g., p+ implants) that will align with an emitter contact (i.e., the portion of the M1 layer dedicated to the emitter contact) are also implanted on the back side of the wafer. The ion implantation doses may typically be on the order of $1\times10^{15}$ up to $1\times10^{16}$ $cm^{-2}$ to form subsequent thermally activated doped regions with maximum doping concentrations on the order of $2\times10^{19}$ up to $5\times10^{20}$ $cm^{-3}$. For the case of implanted dopants, a dielectric passivation layer is then for instance added afterwards to the back side of the wafer. The dielectric passivation layer may reduce recombination near the back surface of the light absorbing layer. The dielectric passivation layer is then etched or ablated down to the wafer in specific locations that align with where the ions were implanted. These locations are where the M1 layer will physically contact the back side of the wafer.

The M1 layer is formed 140 on the dielectric passivation layer and wafer. The patterned M1 layer may be formed using any one of several different processes. For example, the M1 layer may be formed by screen printing and curing of a metal paste (e.g., Al or Al/Si), or by deposition of a metal layer (e.g., using physical vapor deposition (PVD) of a material such as Al) followed by patterning (e.g., using laser ablation or a masked etching process). After the M1 layer is formed 140, conductive (e.g., metallic) landing pad material may also be added (e.g., by screen printing of a suitable metal paste) in the locations where the vias will ultimately be drilled through the backplane. The landing pad material may be screen printed, deposited using PVD, or added using another process. In essence, the lower part of the M1 layer may serve to make good low resistance contact to the underlying silicon while not spiking through the solar cell doped junction, whereas the upper layer may be tuned to provide good resistance to the subsequent via drilling to gain access to said M1 layer. One of the metallization layers or both may also be optimized for low resistance lateral current transport.

The backplane sheet is laminated 150 to the M1 layer and the back side of the light absorbing layer. The lamination process may occur under reduced pressure or vacuum to eliminate air bubbles trapping between the backplane and sheet and the light absorbing layer and to facilitate removal of prepreg curing/outgassing byproduct pump-out. Controlled lamination pressure may be applied to ensure better physical contact across the lateral extents of the backplane sheet and partially processed solar cell. Some controlled amount of heat may also be applied in order to raise the semiconductor substrate and prepreg temperature during the lamination process.

After lamination of the backplane sheet to the backside of the partially processed solar cell, the next steps focus on processing 160 of the front side of the wafer. This may include a thinning etch to reduce the thickness of the semiconductor wafer (e.g., silicon layer) to a specified thickness (for instance, to a final post-etch semiconductor layer thickness in the range of about 20 microns to 100 microns). It may also include the division of a wafer into a plurality of individual subcells (for isled cell "iCell" design) as introduced above. Subsequent frontside processing may include a texturization etch such as an alkaline texture etch to form random pyramid texturing on the surface. Then, front side plasma-enhanced chemical vapor deposition (PECVD) processing may performed to form the frontside passivation layer. An anti-reflection coating (ARC) may also be added on the front side of the wafer to increase the amount of light that makes it into the body of the wafer during operation. In some instances, the same material may serve as both passivation and ARC layer (e.g., a PECVD silicon nitride layer), or alternatively, more than one material layer may be deposited for the passivation and ARC purposes (e.g., aluminum oxide and silicon nitride). A thermal process may be added to optimize the quality of the passivation. For the case of M2 metal foil lamination, which will be described subsequently, it is envisioned optionally combine the thermal budget for the lamination with that required for an optimum passivation quality.

The backplane sheet is laser drilled 170 to create the vias for electrical interconnection between the M1 layer underneath the backplane sheet and the yet-to-be-added M2 layer. The vias extend down to the M1 layer (in some instances the printed landing pads on the M1 layer), thereby exposing the M1 layer.

The M2 foil is laminated 180 onto the backplane sheet and in the vias. The process for formation of the M2 layer to ensure consistent electrical connection with the M1 layer may vary, and a number of different embodiments for performing this step are described further below.

As several steps in the process for fabricating the solar cell involve lamination, a the process includes using a lamination stack and an industrial vacuum press, such as vacuum laminators commonly used in the printed-circuit board (PCB) industry, for example those offered by companies such as Lauffer and Berkle in Germany, To make the overall process more efficient, a single lamination stack of components, prepared in advance, may be used in a number of those separate lamination steps. Specifically, the lamination stack is prepared prior to the lamination of the backplane sheet and M2 layer, and may also be prepared prior to the formation of the M1 layer in an implementation where the M1 layer is formed using the lamination stack. With respect to the M2 layer specifically, as the M2 layer is formed using a single (or multiple) sheets of existing material (e.g., foil) rather than being deposited (e.g. by PVD). Those sheets of material are one such layer that is part of the lamination stack. For example, in one implementation rolls of metal foil to be used as part of the M2 layer are cut to size with a continuous sheet covering either a single solar cell or a plurality of solar cells (for monolithic sheet of solar cells, making so-called monolithic modules). The metal foil is then placed into the lamination stack in contact with the backplane sheet. The backplane sheet and the M2 layer are then laminated using the steps described above and in the following sections.

Table 1 describes representative tools used in the various lamination processes described herein, as well as components in the lamination processes, ordered from top to bottom in Table 1 in order of last to be applied to first to be applied. Example thicknesses for each layer in the lamination stack are provided, however in practice each layer may have a thickness different than the provided example or outside of the provided example range. Example temperatures ranges used as part of the different lamination steps may generally range between 180°-400° C. Example pressures ranges used as part of the different lamination steps may generally range between 10 pounds per square inch (psi) to 300 psi. The vacuum required for vacuum lamination may be created using a suitable vacuum pump and the resulting pumped-down pressure may in some instances be less than about a few Torr down to the mTorr range.

TABLE 1

| Lamination Stack-Up | Materials | Possible Thicknesses/ Thickness Ranges |
|---|---|---|
| Top Plate | Carbon Steel | 1.5 inches (") |
| Release Plate | Stainless Steel, 304 | 0.050" |
| Press Plate | Stainless Steel, 316 | 0.125" |
| Release Film | Tetrafluoroethylene (TFE) Film | 100 μm |
| M2 Layer | Al foil, over the counter "kitchen" grade | 25 μm 50 μm |
|  | Al foil pre-coated with Al-compatible solder (e.g., SAPLATE) | 10-50 μm 5-100 μm 5-150 μm |
|  | Al foil plated solder or solder added using PVD | 5-250 μm |
| Solder Paste | 89% Tin (Sn), 8% Zinc (Zn), 3% Bismuth (Bi), or another set of element ratios | Varying, manually applied |
| Backplane Sheet | Aramid Fiber and Resin Soda Lime Glass Plastics or Other Composites | 25-1000 μm, typically 100 μm |
| M1 Metal Layer | Sintered Aluminum/Silicon Paste, Not Continuous | .1-2 μm <10 μm |
|  | Other elements such as Cu, Nickel (Ni), Titanium (Ti), Cobalt (Co) | 0 to 25 μm |
| Light Absorbing Layer (e.g., Si) | Mono-crystalline (CZ) Si mc-Si | 10-200 μm 60 to 75 μm |
| Release Film | TFE Film | 100 μm |
| Press Plate | Stainless Steel, 316 | 0.125" |
| Bottom Plate | Carbon Steel | 1.5" |

Any remaining steps in solar cell manufacturing can then be performed 190. For example, this may include patterning the M2 layer using one of several embodiments, such as laser ablation or a masking/etching process, or a partial laser ablation of a top metal layer that may serve as an etch mask for underlying metal. This M2 layer patterning may be followed by interconnecting the M2 layer of the solar cells with external circuitry (e.g., bus bars, bypass diodes, local maximum power point tracking devices or others). This may also include laminating the front and back surfaces of the solar cell with appropriate external housings. For example, the front surface of the solar cell can be covered in a flexible, lightweight fluoropolymer, or by a rigid glass-covered material.

II.B Epitaxially Grown Light Absorbing Layer

In reference to the process illustrated in FIG. 2, as above the fabrication process may be split into several subgroups of steps, including those that occur prior to the lamination of the backplane sheet, and those that occur after the lamination of the backplane sheet.

Prior to the lamination of the backplane sheet, the fabrication process begins 110 with a reusable template 210 such as a semiconductor wafer, examples of which include CZ Si, mc-Si, or another semiconductor wafer. If the wafer has been used previously to produce and release another semiconductor layer for solar cell production, it is reconditioned and cleaned as required prior to reuse to make another semiconductor layer for solar cell processing.

A porous silicon epitaxial seed and release layer is formed 220 on the surface of the wafer. In one example, the seed and release layer are different layers having different porosities (but may be formed in the same porous silicon anodic etch equipment). The seed layer on which the epitaxial silicon layer will be grown has a relatively low porosity which favors growth of low-defectivity epitaxial silicon. The release layer in contact with the template has a relatively high porosity, facilitating on-demand lift-off separation once growth of the silicon is complete or at a desired subsequent stage during solar cell processing, such as after M1 formation and backplane lamination. After such porous silicon formation, an in-situ doped thin (e.g., in the thickness range of about 10 to 100 microns) layer of epitaxial silicon is then chemical vapor deposited (so called silicon epitaxy) on silicon template with the porous silicon layers on its surface. This epitaxial silicon layer becomes the light absorbing layer of the solar cell-to-be. In one implementation, the grown layer of epitaxial silicon is between 1-80 μm in thickness. Typical epitaxial layer thicknesses are in the range of about 10 to 50 microns.

Release 255 of the backplane attached epitaxial layer may, for example, be performed by mechanical fracture release, chemical wet etch, air flow release, or a combination thereof. In one monolithic epitaxial cell embodiment two laminations (i.e., double lamination) are used to achieve further processing of the sheet of solar cells by laminating the epitaxial layer while on the template, scribing the outline with a laser, releasing it, then cutting it again to its final size using a laser. At that point, trench cuts for defining the subcells within each isled cell (iCell) may also be carried out. After this a plurality of such backplane reinforced thin silicon cells may be arranged in a rectangular fashion and laminated a second time. Such a laminated monolithic sheet of epitaxial cells may then be processed further in much the same way as a laminated monolithic sheet consisting of e.g. CZ wafers.

After lamination of the backplane sheet, processing 260 of the front side of the light absorbing layer in the partially processed solar cell may be completed. This step may be similar to step 160 above, however, usually thinning does not need to be performed because the light absorbing layer has already been grown to the appropriate thickness, rendering a subsequent thinning step unnecessary.

Other steps after lamination of the backplane sheet may also be identical to the process described above (for example, frontside texture etch, frontside PECVD passivation and ARC deposition, and drilling of the via holes in the backplane in preparation for the M2 metal foil processing). Specifically, steps 170-190 may be identical to the version described with respect to FIG. 1 above. Regarding the lamination 180 of the M2 layer specifically, the different embodiments mentioned above and described below are equally applicable to either of the processes described with respect to FIGS. 1 and 2.

In some cases, it may be advantageous add an additional surface activation step 175 after laser drilling of the backplane via holes before lamination and patterning of the M2 layer 180. The surface activation step cleans the exposed M1 area (e.g., remove residue, oxides) using at least one of a variety of surface activation processes (e.g., ion cleaning, grip blasting for example using baking soda or sand, atmospheric pressure radical clean).

III. Forming the M2 Metallization Layer on the Backplane Sheet

As introduced above, there are several different possible solar cell structures that incorporate an M2 layer made of a high-electrical-conductivity metal foil such as a Cu or Al metal foil. Similarly, there are several different methods for electrically connecting the M2 layer to the M1 layer through the vias in the backplane sheet. What follows is a non-exhaustive list of exemplary structural embodiments and methods for their formation.

The embodiments include at least 1) laminating a metal foil as the M2 layer (described with respect to FIG. 3 below), 2) adding solder after laminating a metal foil as the M2 layer (described with respect to FIG. 4 below), 3) adding a PVD seed of conductive material before laminating a metal foil as the M2 layer (described with respect to FIG. 5 below), 4) fusing previously added metal plugs to a M2 foil using laser irradiation (described with respect to FIG. 6 below), and 5) adding solder before laminating a metal foil as the M2 layer (described with respect to FIG. 7). Each of these embodiments will be described in turn.

Table 2 below summarizes a number of different aspects of these embodiments and provide exemplary material and fabrication details for descriptive purposes. Specific implementations may vary depending on desired solar cell and fabrication characteristics and constraints. The embodiments mentioned above are columns 3-7 of the table. Column 2 represents a prior implementation that uses a PVD M2 layer rather than an M2 foil, for comparison purposes.

TABLE 2

| Attributes | PVD M2 (No Foil) | Laminated M2 Foil | Laminated M2 Foil + Solder Print After Lamination | Laminated M2 Foil + Solder Print Before Lamination | Laminated M2 Foil + PVD Seed Before Lamination | Laminated M2 Foil + Laser Firing After Lamination |
|---|---|---|---|---|---|---|
| M2 Thickness | ~3 μm up to ~8 μm PVD-M2 (Al or Cu) pre-clean + evap | e.g. about 10 μm to 50 μm M2 Foil (Al or Cu) | e.g. about 10 μm to 50 μm M2 Foil (Al or Cu) | e.g. about 10 μm to 50 μm M2 Foil (Al or Cu) | e.g. about 10 μm to 50 μm M2 Foil (Al or Cu) | e.g. about 10 μm to 50 μm M2 Foil (Al or Cu) |
| M2 Process Flow 180 | (1) PVD Al/NiV (2) Pattern Al/NiV (3) Anneal | (1) Laminate Foil (2) Pattern Foil | (1) Laminate Foil (2) Pattern Foil (3) Print Solder (4) Reflow Anneal | (1) Print Solder (2) Laminate Foil (3) Pattern Foil (4) Reflow Anneal | (1) PVD NiV/Sn (2) Laminate Foil (3) Pattern Foil | (1) Laminate Foil (2) Laser Firing (3) Pattern Foil |
| M2 Capital Expenditure 1:5, (Low:High) | 5 | 1 | 3 | 3 | 4 | 2 |

TABLE 2-continued

| Attributes | PVD M2 (No Foil) | Laminated M2 Foil | Laminated M2 Foil + Solder Print After Lamination | Laminated M2 Foil + Solder Print Before Lamination | Laminated M2 Foil + PVD Seed Before Lamination | Laminated M2 Foil + Laser Firing After Lamination |
|---|---|---|---|---|---|---|
| M2 Cost 1:5, (Low:High) | 5 | 1 | 3 | 3 | 4 | 2 |
| M2-M1 Via Resistance Risk | Negligible Risk | Highest Risk Due to No Via Clean | Low Risk Due to Solder Flux | Low Risk Due to Solder Flux | Low Risk Due to PVD Clean + Seed | Low Risk Due to Laser Firing |
| Material Forming Conductive M2-M1 Via Plugs | PVD Al/NiV or Al/NiV/Sn | Al Foil Within Via Holes Making Contact with M1 | Solder + Al Alloy | Solder + Al Alloy | PVD NiV/Sn | Direct foil to M1 welding (e.g., Al to Al) |
| Solderable Cells | Depends on choice of outermost metal or Use Conductive Adhesive or solder paste | No (unless using solderable Al Foil) or Use Conductive Adhesive | Yes (solder also printed where solderable areas are required) | Yes (solder also printed where solderable areas are required) | No (unless using solderable M2 Foil) or Use Conductive Adhesive | No (unless using solderable M2 Foil) or Use Conductive Adhesive |
| Primary Risk to Manage | Sidewall Coverage | Via Resistance Due to Lack of Solder or PVD | Solder Filling of Vias for Low Via Plug Resistance | Flux Trapping Within Laminate | Sidewall Coverage Via Resistance Foil Adhesion | Via Resistance |

III.A Laminated Metal Foil

FIG. 3 is a process for adding the M2 metallization layer to a solar cell, according to a first embodiment. In this embodiment, the M2 foil is added 180 by laminating 310 a high-conductivity metal foil (such as a metal foil comprising Al or Cu) on the backplane sheet. The lamination 310 process may include vacuum pressure pressing the foil into the vias, downwards pressure of the lamination plates pressing the foil against the backplane sheet, and may also include a separate press plate with silicon molds shaped in mounds spaced equally to the vias pushing the foil into the vias. The pressure and vacuum conditions of the laminations help ensure physical contact of the M2 foil with at least a portion of M1 surface exposed at the bottom of the vias. In one specific implementation of this embodiment, the M2 foil may be pre-coated on one or both sides with a solderable material that is compatible with the foil material.

In one implementation, only existing temperature and vacuum conditions maintained throughout the lamination processes are performed in lamination step 310. In another implementation, the M2 foil is further laminated to the backplane using an additional anneal (or thermal lamination) including heating the solar cell to a temperature of between approximately 200-450° Celsius (C). Existing vacuum and pressure conditions occurring at this time also contribute to this additional lamination step. The thermal budget of this lamination step, as provided based on degree and duration of heating, reduces the electrical resistance between the M2 foil and M1 layer. In some cases, the thermal budget for the lamination may also be used to properly anneal the dielectric passivation layers that are in contact with the silicon absorber layer in order to improve the passivation properties, thereby improving the solar cell efficiency.

Generally, lamination is successful when it creates physical contact and effective low-resistance electrical connection between the M2 foil and the underlying M1 layer. In this solar cell, this M2-M1 electrical contact occurs through the via holes. The lamination 310 (with or without an additional anneal) may cause the M2 foil to thermally fuse or weld to the M1 layer. However additional temperature, pressure, and vacuum may assist in creating this low-resistance connection. Generally this embodiment may lend itself well to lower aspect ratios of the via holes (e.g., lower resistance between M1 and M2) where the backplane sheet is comparatively thinner (e.g., on the order of 50-100 μm) and where the vias have comparatively larger diameters (e.g., on the order of approximately 150 to 350 μm) relative to the other embodiments described herein. However, these ranges are merely exemplary, and solar cells fabricated according to this embodiment also function outside these ranges in the other ranges disclosed in Table 1 above.

If the M2 foil has been pre-coated with solder, the above-described lamination 310 steps may melt and reflow the solder to form the conductive via plugs that form within the vias in the backplane sheet. These via plugs help establish a more consistent physical and electrical connection between the M1 and M2 layers.

The laminated metal foil is patterned 320, thereby introducing digitation fingers into the M2 layer, as introduced above. The patterning may be performed using laser ablation, screen (or stencil) printing and wet metal etching, chemical etching with a patterned masking layer, or another similar process.

III.B Solder Print after Metal Foil Lamination

FIG. 4 is a process for adding the M2 metallization layer to a solar cell, according to a second embodiment. In this embodiment, adding 180 the M2 foil includes laminating 410 a high-electrical-conductivity metal foil on the backplane sheet. The lamination step 410 may be the same as the lamination step 310 described previously.

After lamination 310, solder (optionally solder with flux) is printed 420 onto the laminated M2 foil. The solder may be screen (or stencil) printed using a suitable solder for whatever metal the M2 foil is made of (e.g., Sn-based solder when using copper foil or Al foil coated with a solderable layer of Ni/Sn). Although the solder may be printed over the entirety of the M2 foil, less solder may be used by printing the solder only substantially over the vias where the M2 foil is going to contact the M1 layer. In one implementation, the solder is printed in a pattern of bumps. In one implementation, the solder is in powder form when it is printed on the M2 foil.

A solder reflow anneal 430 is performed to form electrically conductive "plugs" that fill the vias and are made of fused M2 foil and solder. In one implementation, the anneal is performed at a temperature in the approximate range of 200-380° C. The reflow anneal may help ensure that the flux-containing solder penetrates through the M2 foil. The reflow anneal may also help ensure that the flux contained within the solder cleans the M1 surface in the via holes. The reflow anneal may also help ensure that a via plug having a strong electrical connection is formed between the thermally alloyed mixture of solder and metal foil. This may help reduces the resistance between the M1 and M2 layers.

The laminated metal foil is patterned 440. The patterning step 440 may be the same as the patterning step 310 described previously.

Figure 8C:
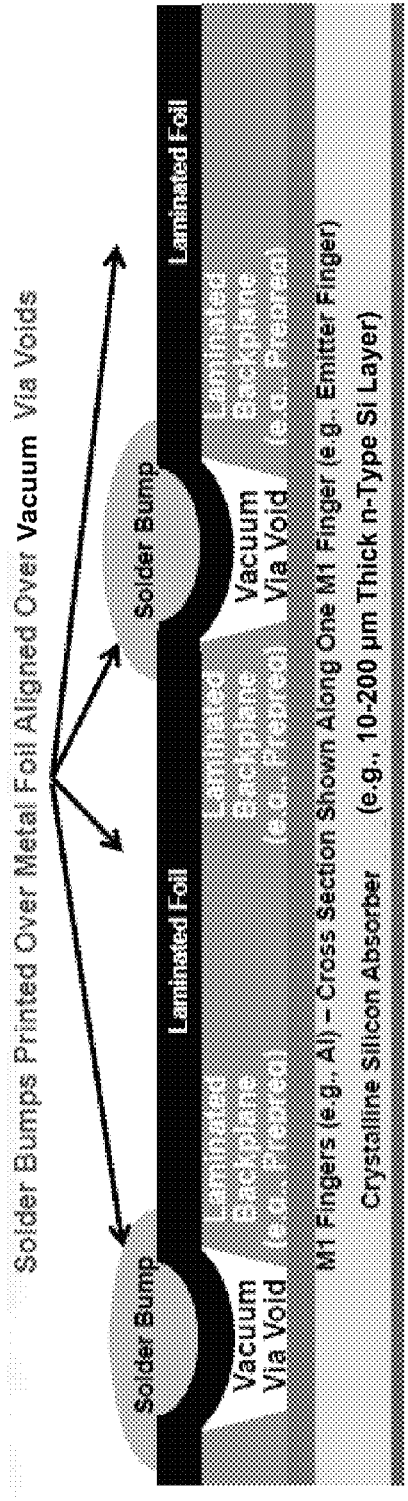
Figure 8D:
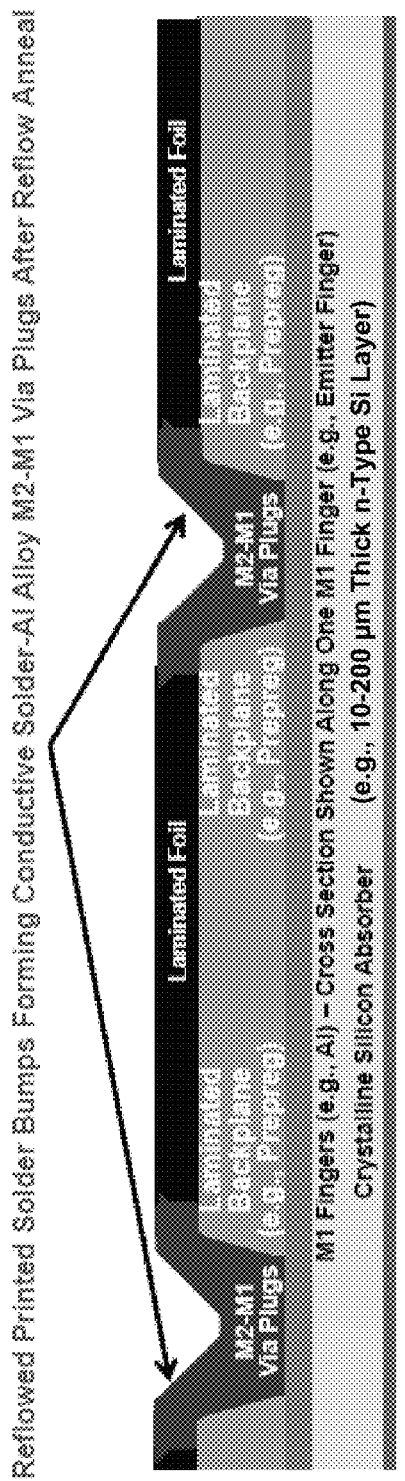
Figure 8E:
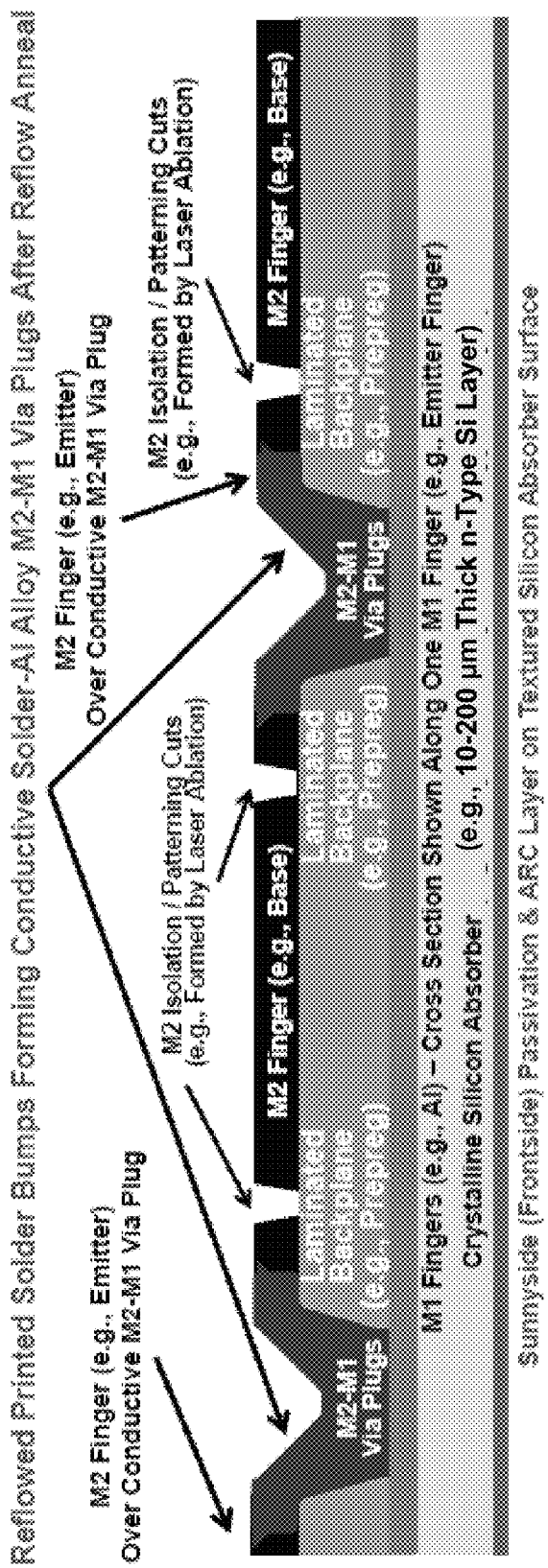
Figure 9C:
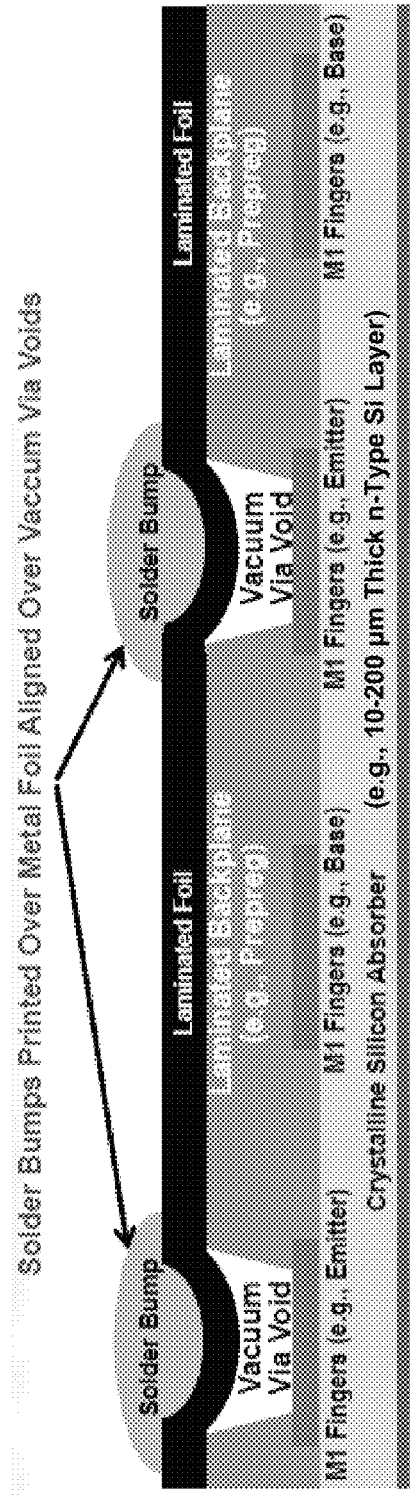
Figure 9D:
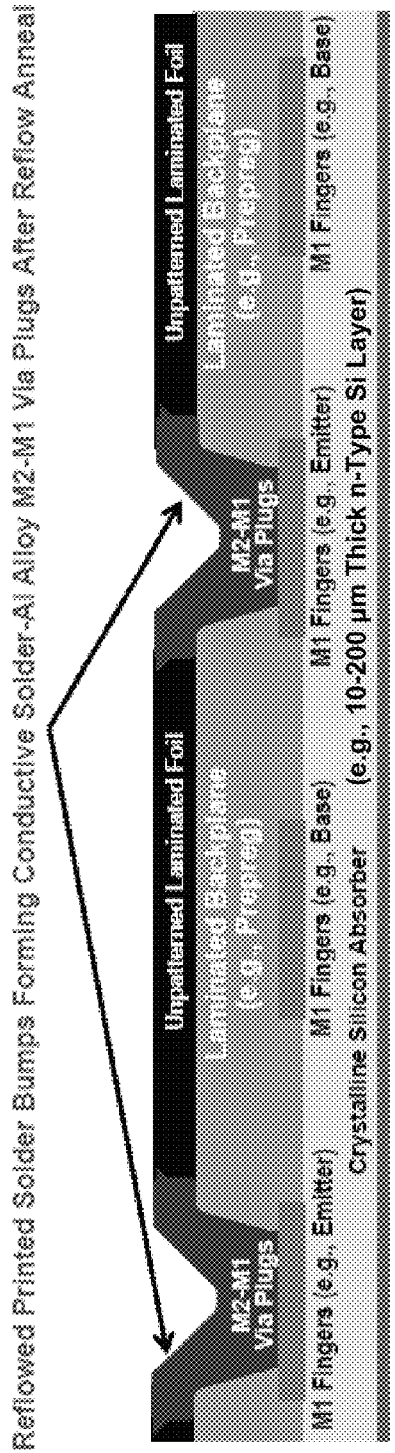
Figure 9E:
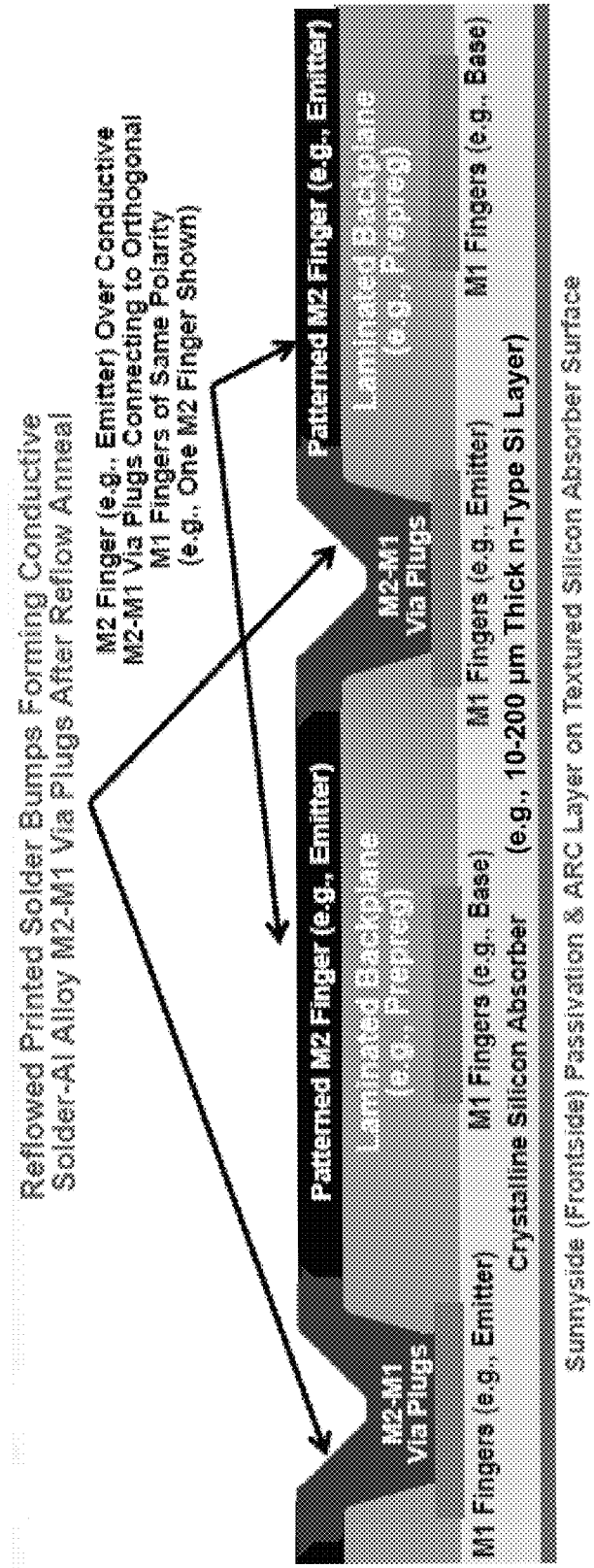

FIG. 8A-8E illustrate a solar cell at various stages throughout the process of forming a solar cell along a direction perpendicular to the M2 interdigitated fingers, according to the second embodiment. FIG. 9A-9E illustrate a solar cell at various stages throughout the process of forming a solar cell along a direction parallel to the M2 interdigitated fingers, according to the second embodiment. FIGS. 8A and 9A illustrate a solar cell after the vias have been formed. FIGS. 8B and 9B illustrate the solar cell after the M2 foil has been laminated to the backplane sheet. FIGS. 8C and 9C illustrate the solar cell after solder bumps have been printed on the laminated M2 foil over the vias. FIGS. 8D and 9D illustrate the solar cell after solder reflow annealing has been formed, such that the solder-metal via plugs connect the M2 and M1 layers. FIGS. 8E and 9E illustrate the solar cell after patterning of the M2 layer.

III.C Solder Print Before Metal Foil Lamination

FIG. 7 is a process for adding the M2 metallization layer to a solar cell, according to a fifth embodiment. In this embodiment, solder bumps are printed 710 within the vias onto the M1 layer directly. Other than this ordering change, the solder printing step 710 is similar to the solder printing step 420 described previously. In some instances, this method uses a flux-free solder since the solder is printed into the via holes prior to the metal foil lamination process (to prevent flux-induced complications such as adhesion and/or corrosion issues).

After the solder bump printing 710, the M2 foil is laminated 720 on the backplane sheet. The lamination step 720 may be the same as the lamination step 310 described previously. A solder reflow anneal 730 may also be performed to form the above-mentioned electrically conductive "plugs" filling the vias where the plugs are made of melted and fused M2 foil and solder. The solder reflow anneal 730 may be similar to the solder reflow anneal step 430 described previously.

In contrast to the previous embodiment where solder paste was added after metal foil lamination, because the solder is printed within vias under the M2 foil, the M2 foil thermal lamination process 720 promotes alloying of the solder within the vias with the overlaid M2 foil as well as with the underlying M1 layer. Thus, in this embodiment both the lamination step 720 and the anneal step 730 promote formation of conductive via plugs that connect the M2 and M1 layers. Alternatively, the anneal step 730 may be omitted and annealing may take place solely due to the vacuum-thermal-pressure lamination process step 720.

The laminated metal foil is patterned 740. The patterning step 740 may be the same as the pattering step 310 described previously.

Figure 14A:
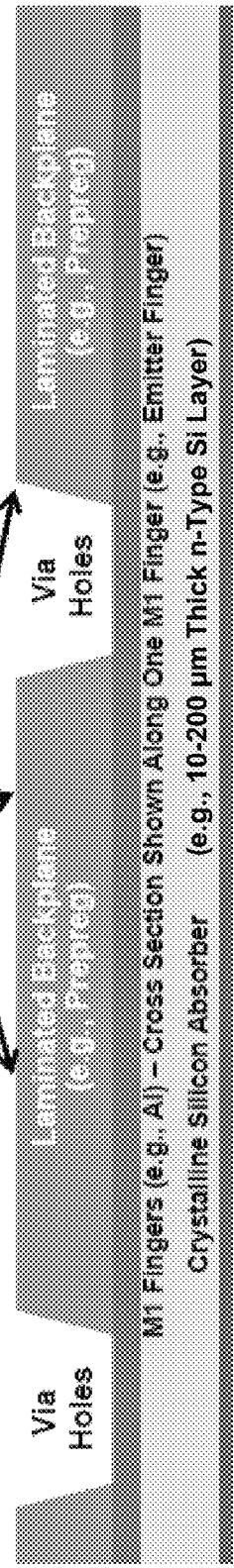
FIG. 14A-14D illustrate an interdigitated back-contact solar cell at various stages throughout the process of forming a solar cell along a direction perpendicular to M2 metal fingers, according to the fifth embodiment.
Figure 14B:
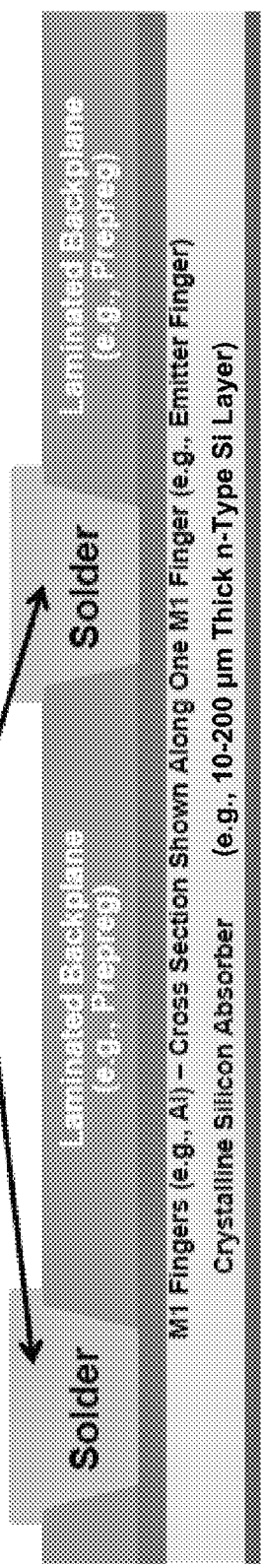
Figure 14C:
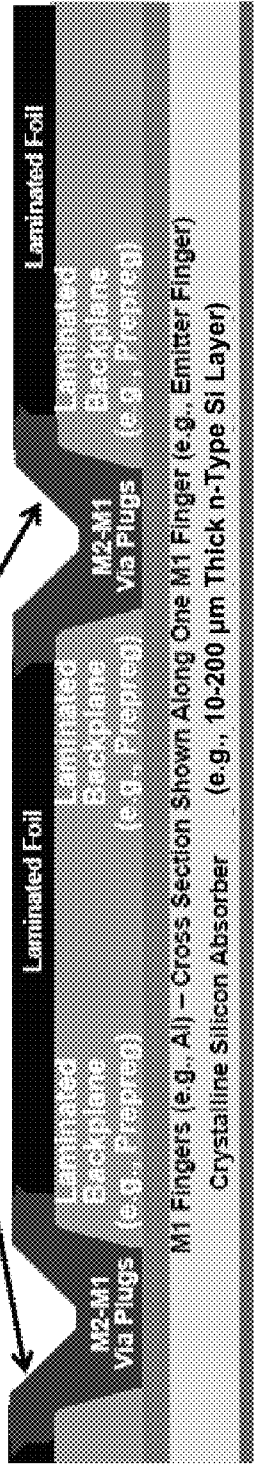
Figure 14D:
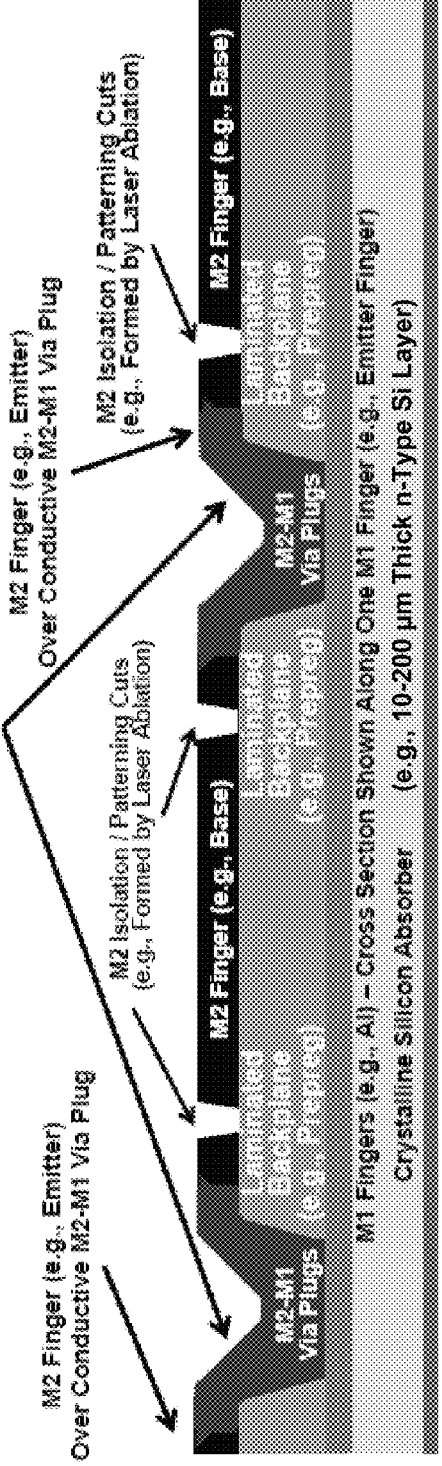
Figure 15A:
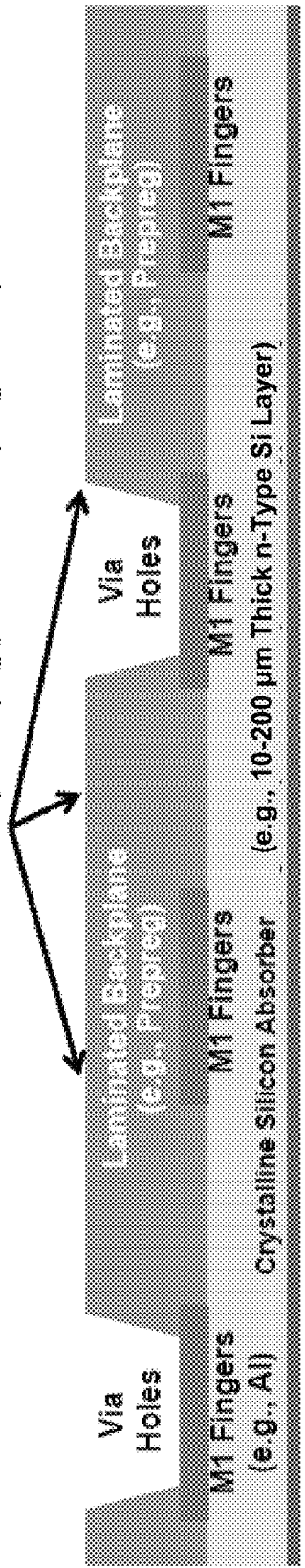
FIG. 15A-15D illustrate an interdigitated back-contact solar cell at various stages throughout the process of forming a solar cell along a direction parallel to M2 metal fingers, according to the fifth embodiment.
Figure 15B:
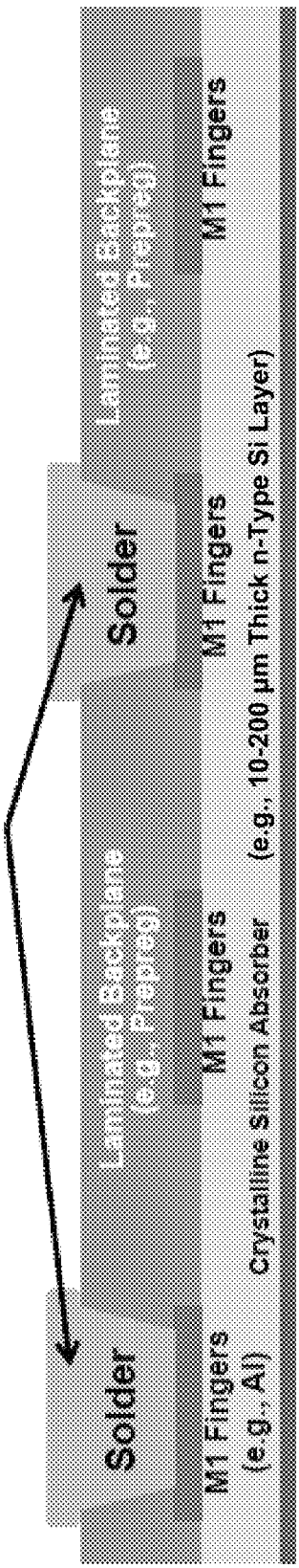
Figure 15C:
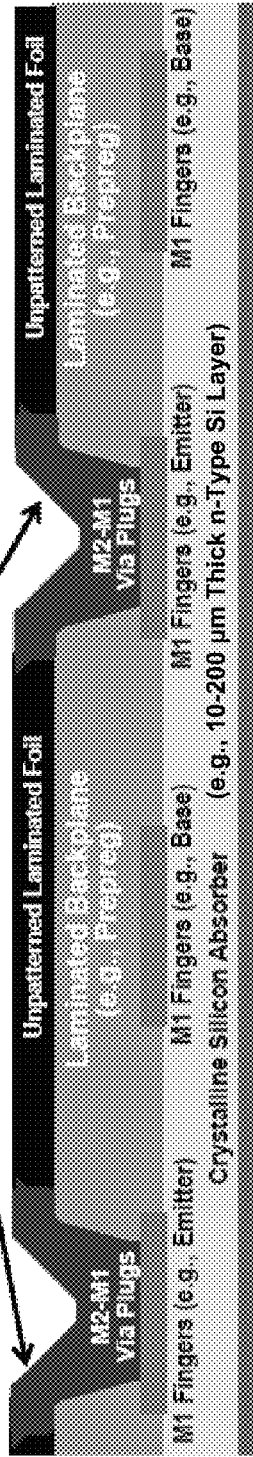
Figure 15D:
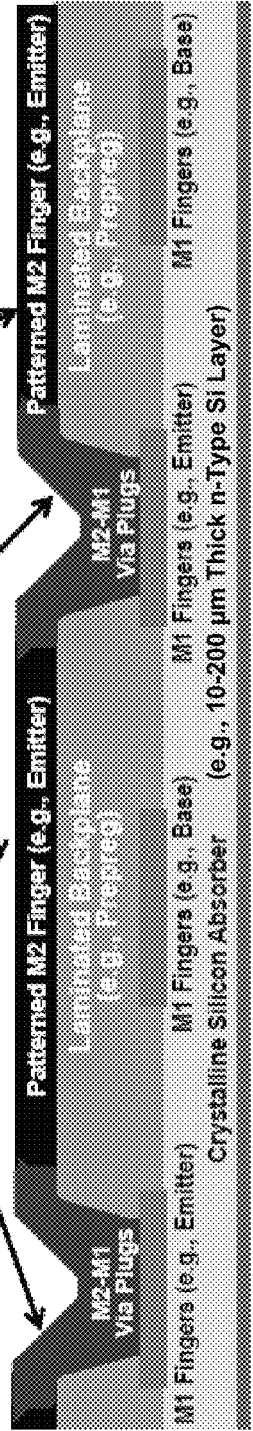

FIG. 14A-14D illustrate a solar cell at various stages throughout the process of forming a solar cell along a direction perpendicular to M2 fingers, according to the fifth embodiment. FIG. 15A-15D illustrate a solar cell at various stages throughout the process of forming a solar cell along a direction parallel to M2 fingers, according to the fifth embodiment. FIGS. 14A and 15A illustrate a solar cell after the vias have been formed. FIGS. 14B and 15B illustrate the solar cell after solder/flux have been printed over (and into) the vias. FIGS. 14C and 15C illustrate the solar cell after M2 foil lamination or alternatively after a solder reflow anneal 730, with metal plugs formed of an alloy of M2 foil, solder, and M1 metal. FIGS. 14D and 15D illustrate the solar cell as M2 foil patterning.

II.D PVD Seed Before Lamination

FIG. 5 describes a process for adding the M2 metallization layer to a solar cell intended to have a final two-level metallization structure, according to a third embodiment. This embodiment uses a cleaning process to clean the vias and the exposed portions of the M1 layer beneath the vias such as RF plasma, DC plasma or ion beam assisted etching of the exposed M1 surface at the bottom of the via, and then a PVD process to deposit a thin "seed" layer of material that may be fused to solderable material on a later-laminated M2 foil layer. This is an alternative to printing solderable bumps onto the M1 layer as described in a previous embodiment.

In this embodiment, the vias are cleaned 510 using a contact sputter/plasma sputtering process. The cleaning 510 process using a plasma sputter etch process removes any oxide and residual contaminants left during the vias drilling process that has formed on the back side of the M1 layer in the vias through the backplane sheet. This helps with the addition of the seed layer and also reduces resistivity of the M2-M1 connection.

PVD deposition 520 is performed prior to lamination 530 of the M2 foil. The seed layer added via deposition 520 includes a thin layer of highly conductive material, such as aluminum, followed by 50 nm to 300 nm of NiV, followed by a thin layer of a solder (such as a Sn or Sn-containing layer). The seed layer promotes subsequent adhesion of the laminated solderable metal foil.

After the addition of the PVD seed layer 520, the M2 foil is laminated 530 on the backplane sheet. The lamination step 520 may be the same as the lamination step 310 described previously. In this embodiment, the M2 foil may pre-coated with another metal such as Ni and optionally a solder that is compatible with Al or with the surface of the PVD deposited sheet layer (e.g., any of the above referenced solders). When using a copper metal foil, the copper metal foil may be optionally pre-coated with a thin layer of tin (Sn) prior to the metal foil lamination.

The heating portion of the lamination step 530 may cause solder reflow, resulting in the solder and metal on the M1 layer alloying with the solder and metal coated on the M2 foil. This reduces the resistance of the electrical contact between the M1 and M2 layers. In case that after lamination the foil does not conformally cover the via holes, the current from and to the via hole can still flow through the PVD seed layer and be transferred to the highly conductive aluminum foil on top of the via through the PVD seed layer on the via sidewalls. Ideally the PVD seed layer, the via hole geometry and the total via hole count are all selected such that the total series resistance from extracting the current from M1 through the via by the PVD layer and from there to the foil does not significantly affect the overall series resistance and thus not significantly reduce the fill factor of the cell and module. A key feature of the PVD seed in this case is that once the current is extracted from the hole, a large contact area to the M2 foil above may be utilized to assure good conductivity and current transfer.

The laminated metal foil is patterned 540. The patterning step 540 may be the same as the patterning step 310 described previously.

Figure 10A:
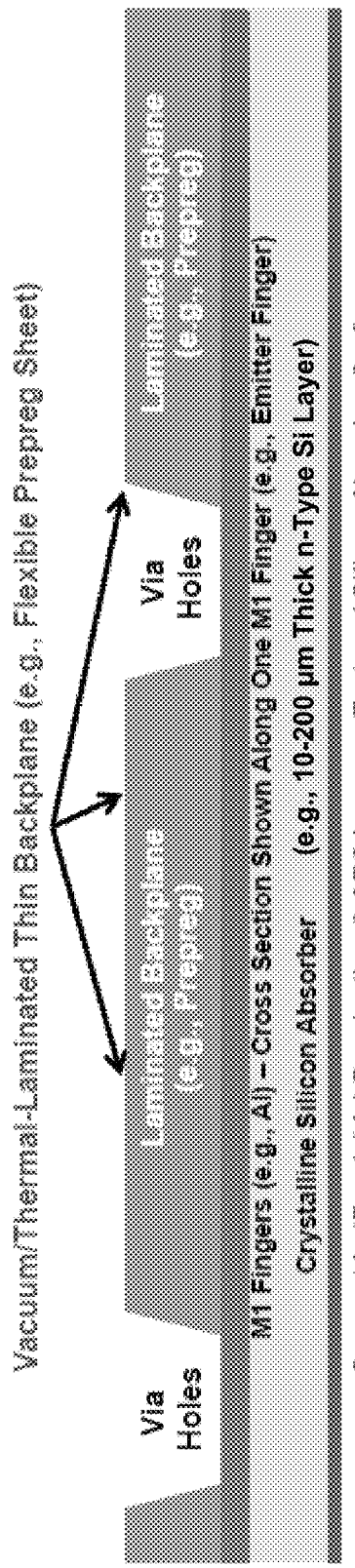
FIG. 10A-10D illustrate an interdigitated back-contact solar cell at various stages throughout the process of forming a solar cell along a direction perpendicular to M2 metal fingers, according to the third embodiment.
Figure 10B:
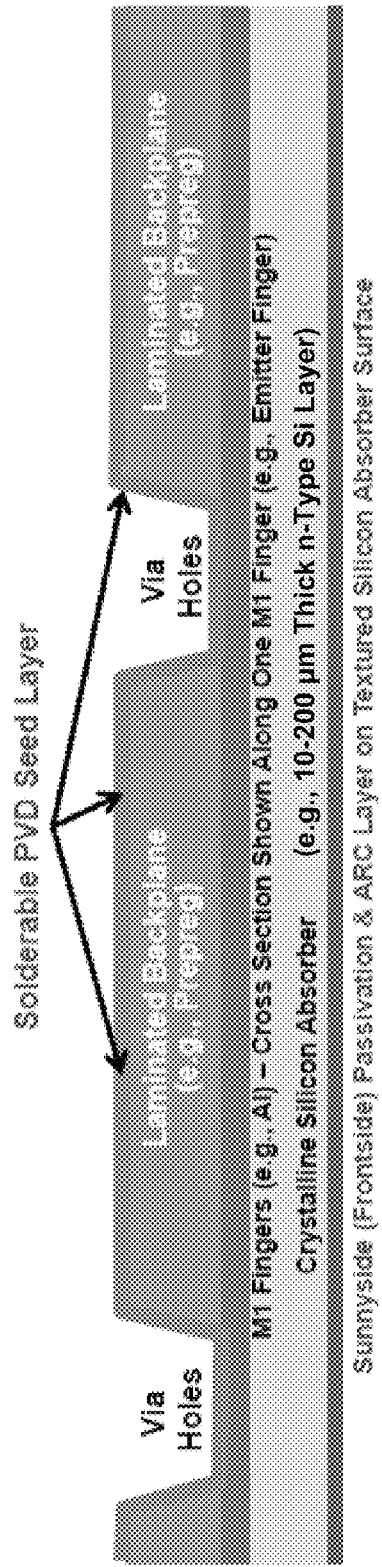
Figure 10C:
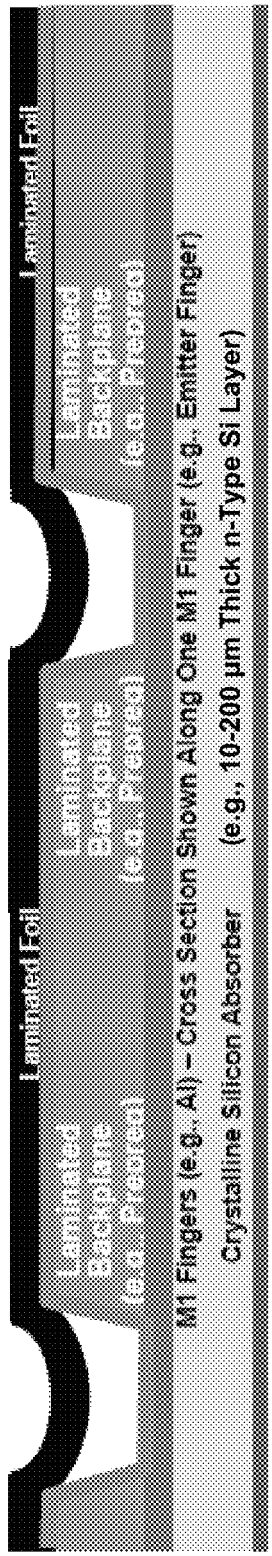
Figure 10D:
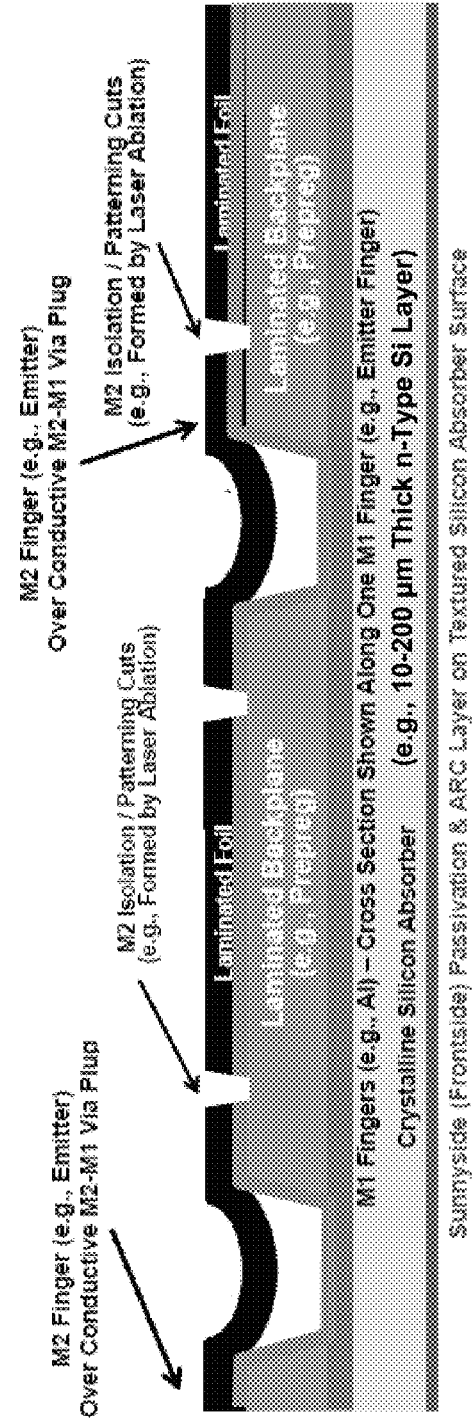
Figures 11A, 11B:
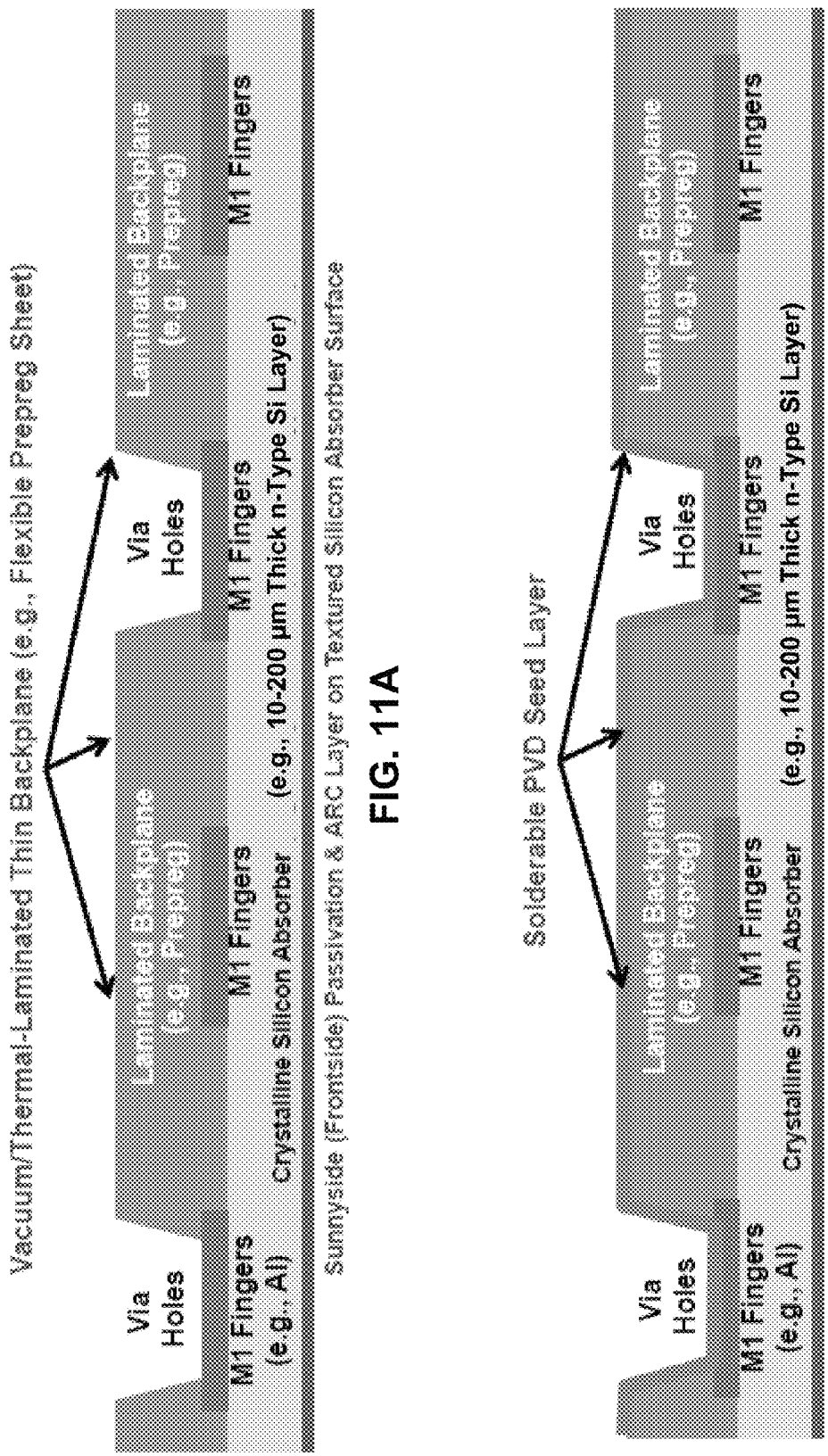
FIG. 11A-11D illustrate an interdigitated back-contact solar cell at various stages throughout the process of forming a solar cell along a direction parallel to M2 metal fingers, according to the third embodiment.
Figure 11C:
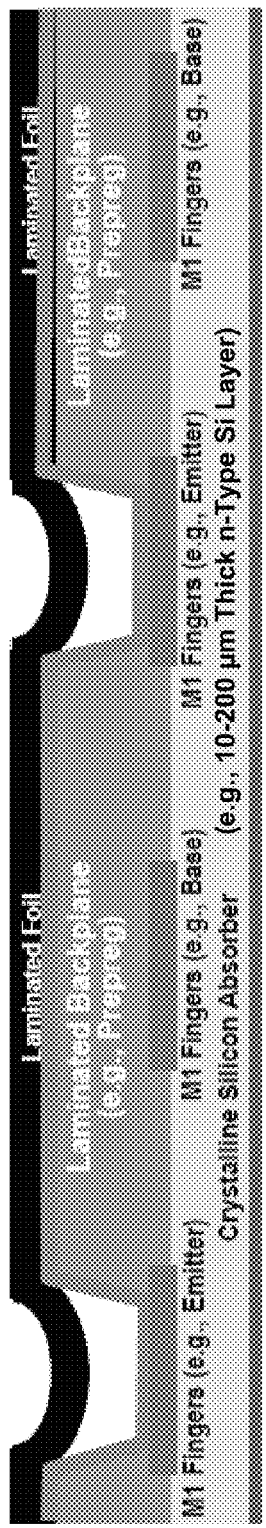
Figure 11D:
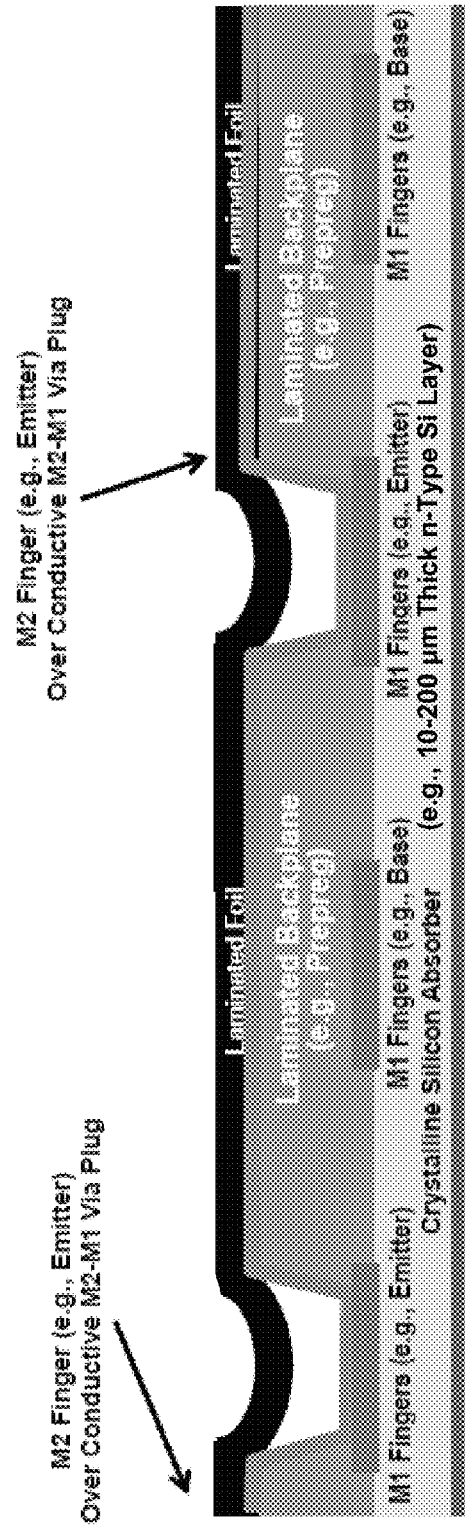

FIG. 10A-10D illustrate a solar cell at various stages throughout the process of forming a solar cell along a direction perpendicular to M2 fingers, according to the third embodiment. FIG. 11A-11D illustrate a solar cell at various stages throughout the process of forming a solar cell along a direction parallel to M2 fingers, according to the third embodiment. FIGS. 10A and 11A illustrate a solar cell after formation of the vias. FIGS. 10B and 11B illustrate the solar cell after cleaning of the vias and deposition of a seed layer. FIGS. 10C and 11C illustrate the solar cell after lamination of the M2 foil. FIGS. 10D and 11D illustrate the solar cell after patterning of the M2 foil.

II.E Laser Firing after Lamination

FIG. 6 is a process for adding the M2 metallization layer to a solar cell intended to have a two-level metallization structure, according to a fourth embodiment. In this embodiment, the M2 foil is laminated 610 to the backplane sheet as well as over the vias. The lamination step 610 may be the same as the lamination step 310 described previously.

Metal via plugs are formed by pulsing 620 the activation of a laser for nanoseconds at a time into the vias. The laser may soften or melt the M2 foil in the vias allowing the M2 foil to fuse or weld to the underlying M1 layer beneath the vias. Example choices for lasers for this fusing process are pulsed nanosecond and in some instances pulsed microsecond lasers having a wavelength selected in the range of UV to IR. This approach works most effectively when the M2 foil lamination 610 results in direct physical contact between the M2 foil and M1 layer within the via holes. Similarly to the first embodiment described with respect to FIG. 3 above, this may be accomplished where the backplane sheet is comparatively thin, and where the vias have comparatively large diameters compared to the other embodiments described herein.

The laminated metal foil is patterned 630. The patterning step 630 may be the same as the pattering step 310 described previously. Notably, in this embodiment, the pulsed laser processing step 620 and the pattering step 630 may be performed using the same laser processing tool, or same tool generally using two different lase sources (one for laser welding/fusing of M2-M1 through vias and the other one for laser ablation patterning of M2), which may reduce the cost and complexity of the fabrication process by reducing the overall number of and capital cost tools needed to complete fabrication.

Figure 12A:
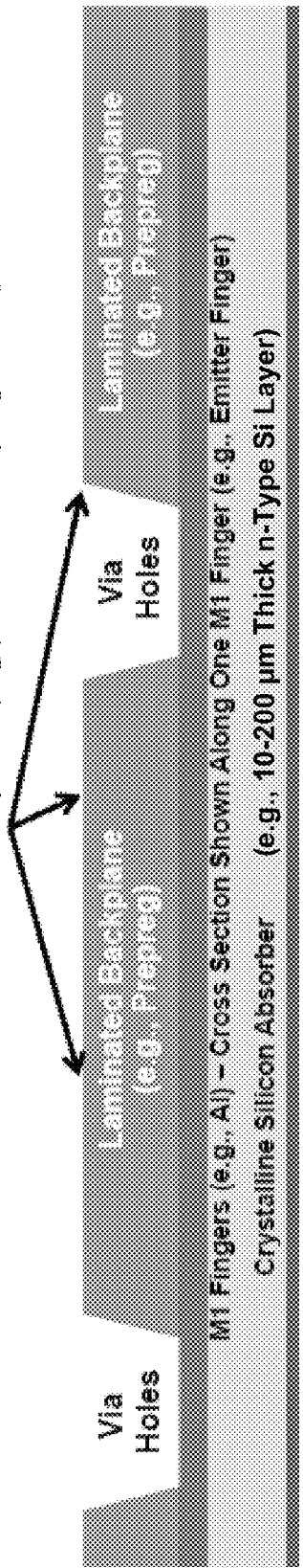
FIG. 12A-12D illustrate an interdigitated back-contact solar cell at various stages throughout the process of forming a solar cell along a direction perpendicular to M2 metal fingers, according to the fourth embodiment.
Figure 12B:
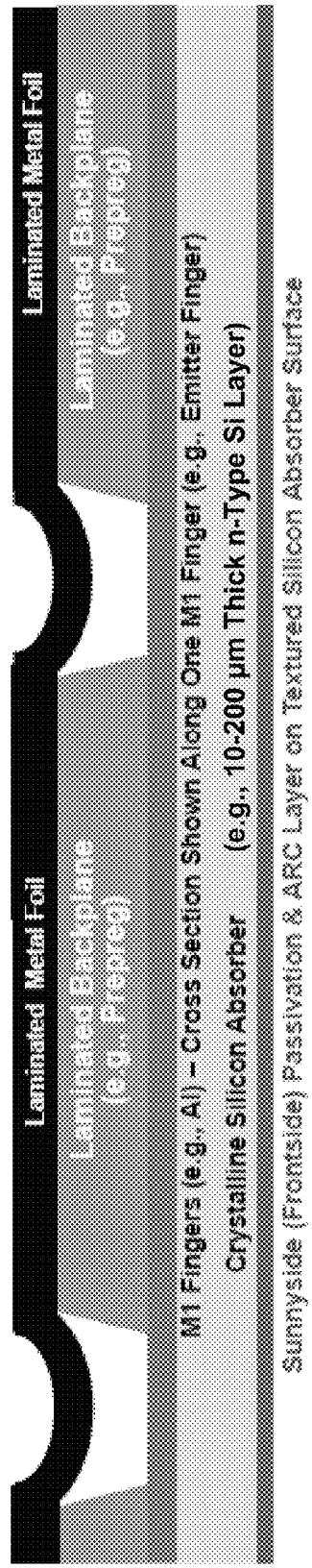
Figure 12C:
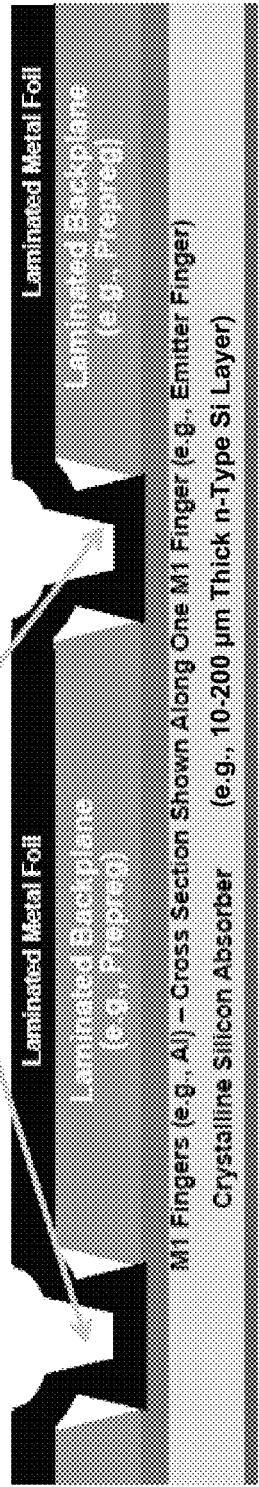
Figure 12D:
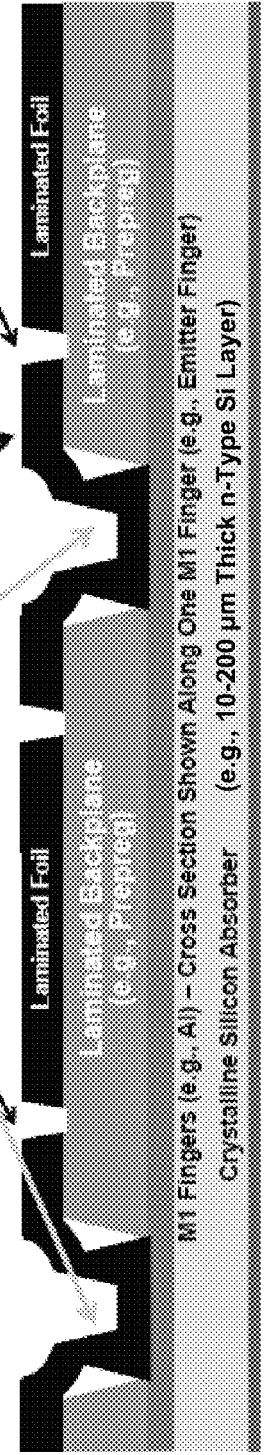
Figure 13A:
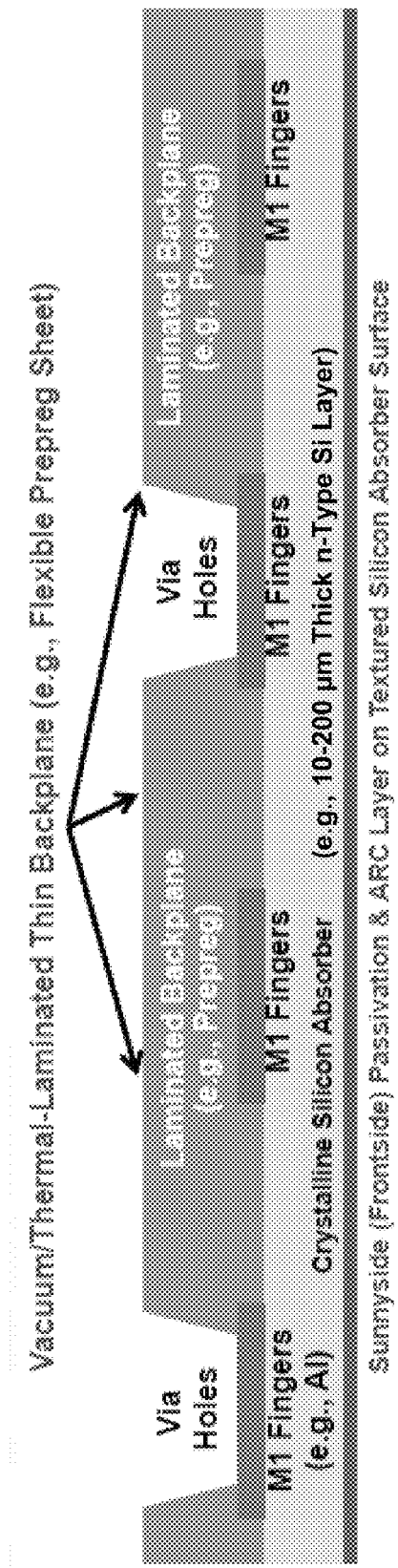
FIG. 13A-13D illustrate an interdigitated back-contact solar cell at various stages throughout the process of forming an interdigitated back-contact solar cell along a direction parallel to M2 metal fingers, according to the fourth embodiment.
Figure 13B:
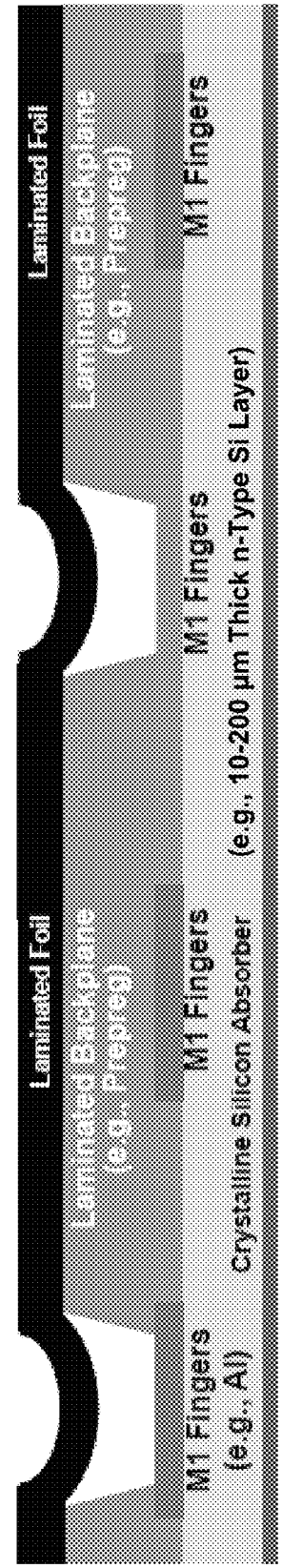
Figure 13C:
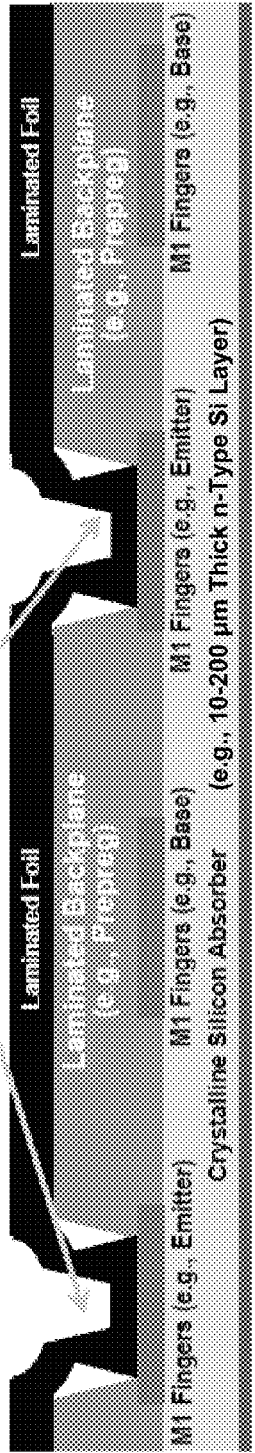
Figure 13D:
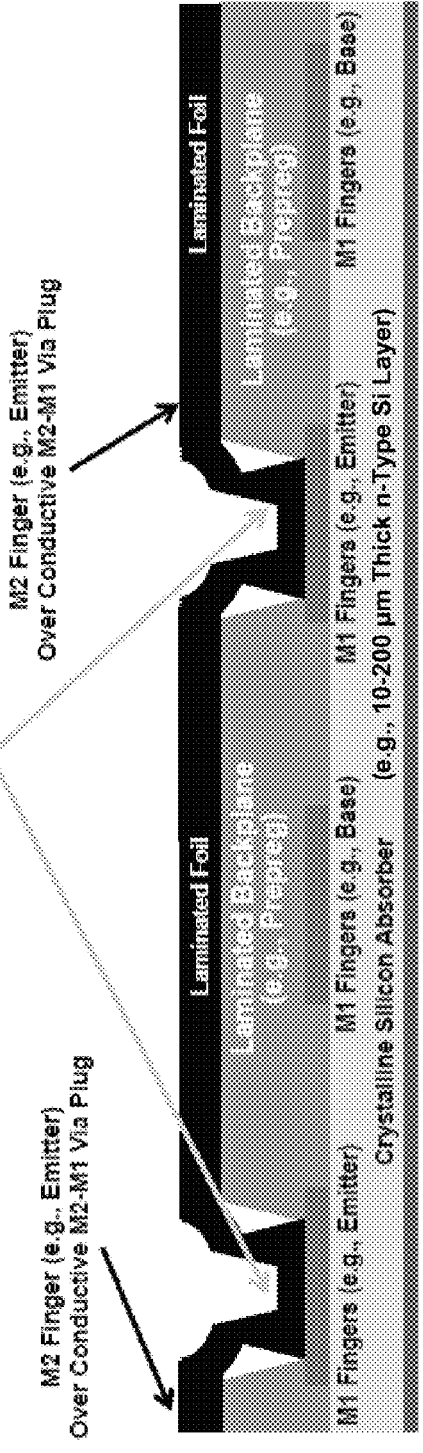

FIG. 12A-12D illustrate a solar cell at various stages throughout the process of forming a solar cell along a direction perpendicular to M2 fingers, according to the fourth embodiment. FIG. 13A-13D illustrate a solar cell at various stages throughout the process of forming a solar cell along a direction parallel to M2 fingers, according to the fourth embodiment. FIGS. 12A and 13A illustrate a solar cell after formation of the vias. FIGS. 12B and 13B illustrate the solar cell after laminating the M2 foil to the backplane sheet and vias. FIGS. 12C and 13C illustrate the solar cell after laser pulsing to fuse the M1 and M2 foil layers. FIGS. 12D and 13D illustrate the solar cell after patterning of the M2 foil.

III. Metal Foil Parameters

A wide variety of metals may be used as the M2 foil layer. However, as low cost is an important factor in producing a commercially viable solar cell, some metals may be too expensive to justify producing in a foil form at volume in some solar cell applications. Two metals that have acceptable electrical conductivity performance at competitive price points for large volume production are aluminum (Al) and copper (Cu). Either Al or Cu may be used as the M2 foil layer. Sn foil or foils containing Sn may also be considered (though in some instances less desirable because of the relatively lower electrical conductivity of tin and much lower melting point of tin with respect to copper or aluminum). Table 2 illustrates several performance characteristics which are relevant for selection of the suitable metal material used in the M2 foil, as well as current cost considerations for which metal would be preferable for use in the M2 foil. Though it is understood that the material properties of these metals remain unchanged for given purities and compositions, the relative availabilities and costs of these metals may change over time. Thus, the below numbers are exemplary, and different conclusions could be drawn (and thus different metals used in the M2 foil) depending on desired particular solar cell and fabrication characteristics and should the costs of these metals change.

TABLE 3

| Attributes | Aluminum Foil | Copper Foil |
| --- | --- | --- |
| Volume Foil Cost | ~$2000 per metric ton | ~8000 per metric ton |
| Density | 2.70 g/cm$^3$ | 8.96 g/cm$^3$ |
| Resistivity | 2.82 μΩ · cm | 1.68 μΩ · m |
| M2 Foil Thickness for 1 mΩ/Square Sheet Resistance | 28.2 μm | 16.8 μm |
| M2 Foil Weight per Cell for 1 mΩ Sheet Resistance | 1.853 g (per 156 mm by 156 mm cell) | 3.663 g (per 156 mm by 156 mm cell) |
| M2 Foil Cost per Cell for 1 mΩ Sheet Resistance | ~0.37 cents (per 156 mm by 156 mm cell) | ~2.93 cents (per 156 mm by 156 mm cell) |
| Thermal Conductivity | 205 W/(m · K) | 401 W/(m · K) |

Relative to Cu, Al has a lower density and a higher resistivity, rendering it inferior to Cu for use in the solar cell for these properties. However, it is lighter per-mΩ of sheet resistance than Cu, rendering it superior to Cu when considering the overall weight of the solar cell (lighter is better). Both Al and Cu offer relatively high thermal conductivity (attractive for heat dissipation in solar cells), with copper being a better thermal conductor than aluminum (for the same thickness). However, per mΩ of sheet resistance, Al is cheaper than Cu for use in solar cells. Thus, when considering both cost and weight, and because both metals provide at least adequate performance with respect to the other properties, for a given sheet resistance requirement Al foil may advantageous over Cu in some instances. Importantly, however, the structures and fabrication processes provided herein may be implemented with both Al and Cu foil material used for M2, as well as additional M2 metallization materials, depending on desired solar cell and fabrication characteristics and limitations.

As an example, assume the volume foil cost listed above, and further assume a 15 µm thick Al foil for the M2 foil. Each 156 mm×156 mm solar cell uses equivalent of about 250 cm$^2$×0.0015×2.7 g/cm$^3$≈1 gram of Al. Depending on the purchase volume of the foil rolls, the bulk cost of 1 g of Al foil (for 15 µm thick M2 foil) is in the approximate range of 0.20 to 0.50 dollar cents (or <0.1 cents per watt). Other solar cell sizes are also possible, other common examples include 125×125 mm and 210×210 mm.

Inexpensive Al foil is widely available in volume rolls in the foil thickness range of about 6 µm up to about 200 µm. Thickness even as thin as 10 µm may ensure negligible metallization ohmic losses for large-area solar cells fabricated using the processes described herein. This is in part due to the solar cells having relatively modest sheet resistivity/conductivity, which is a function of the orthogonal orientation of M2 fingers with respect to M1.

The remaining paragraphs in this section provide detail regarding processing steps relating to the M2 layer that may be utilized in the various embodiments introduced above.

Foil Processing Example One—Aluminum foil pre-coated with a suitable solder layer. The second-level metallization is accomplished using inexpensive aluminum foil coated with a low melting temperature solder, processed in a single-step lamination forming a continuous M2 layer connected by solid metal plugs in vias to first-level metallization.

Coated aluminum foil (such as solderable aluminum, also known as SAPLATE, a trade name from Toyo Kohan of Japan) is procured from volume sources in roll form.

Al foil is cut to size with a continuous sheet covering either single or multiple cells.

Al foil is placed into the lamination stack with solder coated surface in contact with the continuous electrically insulating backplane layer (such as a prepreg layer).

Metallization and electrically insulating continuous backplane lamination stack is assembled per the generic lay-up diagram on the following page.

Al foil lamination process is performed to melt and reflow the solder to form the conductive via plugs within the pre-drilled (or pre-formed) via holes in the backplane layer and form a solid connection between first-level and second-level metallization.

Assembly or cell processing is progressed into later cell process steps to perform metal isolation and form the final patterned second-level metallization (M2) layer Foil processing example one may have the advantages of:
Patterned second-level metal (M2), conductive via plugs, and electrical interconnections between first (M1) and second (M2) level metal are all achieved in a single step.
Reduced production tool cost using a simple thermal-vacuum laminator.
Reduced material costs using inexpensive solder-coated aluminum foil.

Foil Processing Example two—Aluminum foil pre-coated with a flux. Second-level metallization is accomplished using inexpensive aluminum foil coated with solder flux processed in a single step lamination to form a continuous M2 layer connected by solid aluminum plugs in vias to first-level metallization.

Coated aluminum foil is procured from volume sources in roll form.

Aluminum (Al) foil is cut to size with a continuous sheet covering either single cell (for individual (for non monolithic module) or a plurality of cells (for monolithic module).

Al foil is placed into the lamination stack with flux coated aluminum foil surface in contact with the prepreg layer.

Lamination stack is assembled per the generic lay-up diagram on the following page.

Lamination process is performed to melt and reflow the aluminum foil to form the conductive via plugs and the electrical interconnections between patterned first-level metallization (M1) and patterned second-level metallization (M2) according to a specified M2-to-M1 interconnection pattern (for instance, coarse-pitch interdigitated M2 fingers arranged substantially orthogonally or perpendicularly to fine-pitch interdigitated M1 fingers, interconnected by a plurality of conductive via plugs through the electrically insulating backplane layer).

Assembly is progressed into later cell process steps to perform metal isolation (i.e., to complete patterning of M2 layer, for instance, by laser ablation or chemical etching).

Foil processing example two may have the advantages of:
Second-level metallization (M2), electrically conductive via plugs, and electrical connections from first level (M1) to second level (M2) metal achieved in a single step.
Reduced tool cost using simple thermal-vacuum laminator.
Further reduction in material costs using inexpensive flux coated aluminum foil.

Foil Processing Example Three—Aluminum foil and solder paste in two step process. Second-level metallization is accomplished using inexpensive aluminum foil and screen printed solder paste processed in a two step lamination process to form a continuous M2 layer connected by solid metal plugs in vias to first-level metallization. For example, two step processes:

Step one:
Un-coated (hence, cheaper) aluminum foil is procured from volume sources in roll form.
Foil is cut to size with a continuous sheet covering either single cell (for non monolithic module) or a plurality of cells (for monolithic modules).
Foil is placed into the lamination stack in contact with the prepreg layer.
Thermal-vacuum lamination process is performed to bond the aluminum foil to the prepreg and to place the backplane via holes under relative vacuum (or reduced pressure).

Step two:
Assemblies are processed through screen print or stencil print or solder paste dot dispensing step to place solder paste substantially on the aluminum foil over the underlying via locations.
Assembly is placed into a lamination stack.
Thermal-vacuum lamination process is performed to cause eutectic melting of the patterned solder paste spots and aluminum foil, melt flows to fill the vias and to form the conductive vias.
Assembly is progressed into later cell process steps to perform metal isolation.

Foil processing embodiment three may have the advantages of:
Second-level metallization (M2), conductive via plugs, and electrical interconnections from first (M1) to second (M2) level metal achieved in two steps.
Reduced tool cost using simple thermal-laminators.
Reduced material costs using very inexpensive aluminum foil and solder paste.

VI. Additional Considerations

Upon reading this disclosure, those of skill in the art will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for fabricating a back contact solar cell comprising:
preparing a semiconductor light absorbing layer;
forming a first-level metal (M1) layer, the M1 layer on a back side of the light absorbing layer, the back side being opposite from a front side of the light absorbing layer designed to receive incident light;
laminating an electrically insulating backplane sheet on the M1 layer, the backplane sheet comprising a plurality of via holes that expose portions of the M1 layer beneath the backplane sheet; and bringing an M2 layer in permanent contact with the backplane sheet, the M2 layer containing a sheet of metal foil material comprising a thickness of between 5-250 micrometers (um), the M2 layer electrically connected to the M1 layer through the via holes in the backplane sheet; wherein the method further comprises:
cleaning, prior to lamination of the M2 layer, the exposed surface of the M1 layer in the via holes to remove oxides and organic residue formed thereon;
depositing, prior to lamination of the M2 layer, a seed layer which makes electrical contact with the exposed cleaned M1 layer in the via holes, and with a solderable surface comprising a solder compatible with the metal foil; and
wherein laminating the M2 layer on the backplane sheet further comprises heating the M2 layer to cause the solderable seed layer surface and the metal foil to form an alloy or metallic compound across the cell area that physically and electrically connects the M1 and M2 layers.

2. The method of claim 1 wherein the laminating the M2 layer comprises placing the metal foil on the backplane sheet under vacuum and heating the M2 layer to a temperature between 180-400° Celsius for a duration of time under a pressure of between 10-300 pounds per square inch (psi).

3. The method of claim 2 wherein the M2 layer further comprises a pre-coated solder compatible with the metal foil, and wherein the heating of the M2 layer causes the pre-coated solder and the metal foil to form a metallic compound in the via holes that physically and electrically connect the M1 and M2 layers.

4. The method of claim 1 further comprising:
placing the metal foil on the backplane sheet;
irradiating the M2 layer over the via holes with a plurality of pulses of a laser thereby causing the metal foil to fuse with the M1 layer.

5. The method of claim 1 wherein preparing the light absorbing layer comprises: performing a saw damage removal on a semiconductor wafer; and cleaning the semiconductor wafer.

6. The method of claim 1 wherein preparing the light absorbing layer comprises: forming a porous semiconductor epitaxial seed layer on a semiconductor wafer; and depositing a layer doped epitaxial semiconductor material to grow the light absorbing layer.

7. The method of claim 1 wherein preparing the light absorbing layer comprises: implanting ions into the back side of the light absorbing layer, the implanted ions comprise emitter dopants and base dopants, the emitter and base dopants located in separate locations across the light absorbing layer.

8. The method of claim 1 wherein forming the M1 layer comprises: patterning the M1 layer to create interdigitated patterns of fingers, the fingers associated with either an emitter contact or a base contact.

9. The method of claim 1 wherein laminating the backplane sheet on the M1 layer comprises:
laminating the backplane sheet on the M1 layer without the via holes; and
drilling the via holes into the backplane sheet.

10. The method of claim 1 further comprising:
forming a passivation layer on the front side of the light absorbing layer;
adding an anti-reflection coating to the front side of the light absorbing layer.

11. The method of claim 1 further comprising:
laminating the front side of the light absorbing layer with at least one from the group consisting a flexible fluoropolymer covering or a glass covering.

12. The method of claim 1 wherein the step of cleaning, prior to lamination of the M2 layer, the exposed surface of the M1 layer in the via holes to remove oxides and organic residue formed thereon, comprises using a plasma sputter etch process.

13. The method of claim 1, wherein the step of depositing, prior to lamination of the M2 layer, a seed layer further comprises: depositing a first layer of highly conductive material, which is followed by depositing a second layer of material, and which is followed by depositing a third layer of solder.

14. The method of claim 13, wherein the first layer comprises aluminum, and the second layer comprises Nickel-Vanadium (NiV).

* * * * *